(12) United States Patent
Liang et al.

(10) Patent No.: US 12,308,790 B2
(45) Date of Patent: May 20, 2025

(54) PHOTOVOLTAIC POWER CONVERSION APPARATUS

(71) Applicant: Huawei Digital Power Technologies Co., Ltd., Shenzhen (CN)

(72) Inventors: Chengchen Liang, Shanghai (CN); Zhangrui Chen, Shanghai (CN); Mingyuan Zhang, Shanghai (CN); Dong Chen, Shanghai (CN); Yanzhong Zhang, Shanghai (CN); Yong Cao, Shenzhen (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 761 days.

(21) Appl. No.: 17/396,080

(22) Filed: Aug. 6, 2021

(65) Prior Publication Data

US 2022/0302874 A1    Sep. 22, 2022

Related U.S. Application Data

(63) Continuation of application No. PCT/CN2021/088724, filed on Apr. 21, 2021.

(30) Foreign Application Priority Data

Mar. 17, 2021    (CN) .......................... 202120550793.X

(51) Int. Cl.
*H02S 40/32*    (2014.01)
*H02J 3/38*    (2006.01)
(Continued)

(52) U.S. Cl.
CPC .............. *H02S 40/32* (2014.12); *H02J 3/381* (2013.01); *H02J 7/0042* (2013.01); *H02J 7/345* (2013.01);
(Continued)

(58) Field of Classification Search
CPC .......... H02S 40/30; H02S 40/32; H02S 40/34; H02J 3/381; H02J 7/0042; H02J 7/345;
(Continued)

(56) References Cited

U.S. PATENT DOCUMENTS

| 5,896,288 A | 4/1999 | Lecheler et al. |
|---|---|---|
| 8,159,849 B2 | 4/2012 | Nakajima et al. |

(Continued)

FOREIGN PATENT DOCUMENTS

| CN | 201846224 U | 5/2011 |
|---|---|---|
| CN | 102422429 A | 4/2012 |

(Continued)

OTHER PUBLICATIONS

Original Language CN20364554 (Year: 2014).*

(Continued)

*Primary Examiner* — Roshn K Varghese
(74) *Attorney, Agent, or Firm* — WOMBLE BOND DICKINSON (US) LLP

(57) ABSTRACT

Embodiments of this application provide a photovoltaic power conversion apparatus. The photovoltaic power conversion apparatus includes a first housing, a power component, at least one second housing, and at least one wiring terminal. The first housing forms a first accommodation cavity, and the power component is fixedly disposed in the first accommodation cavity. The at least one of the second housing forms a second accommodation cavity, and the at least one second housing is disposed outside a connection area of a first side wall of the first housing by using an installation wall. The wiring terminal sealingly penetrates through a part of the connection area of the first side wall, a first end of the wiring terminal is located in the first accommodation cavity, and a second end of the wiring terminal is located in the second accommodation cavity.

28 Claims, 15 Drawing Sheets

(51) Int. Cl.
*H02J 7/00* (2006.01)
*H02J 7/34* (2006.01)

(52) U.S. Cl.
CPC ....... *H02J 2207/20* (2020.01); *H02J 2207/50* (2020.01); *H02J 2300/24* (2020.01)

(58) Field of Classification Search
CPC ............... H02J 2207/20; H02J 2207/50; H02J 2300/24; H05K 7/1432; H05K 5/06; H05K 5/0004; H05K 5/0217; H05K 5/0247; H05K 5/03; H05K 5/069; H02M 1/44; H02M 3/003; H02M 7/003; H02G 3/16

See application file for complete search history.

(56) References Cited

U.S. PATENT DOCUMENTS

| | | |
|---|---|---|
| 2008/0291609 A1 | 11/2008 | Victor et al. |
| 2012/0127770 A1 | 5/2012 | Kim |
| 2012/0167950 A1* | 7/2012 | Oldenkamp ........... H01L 31/048 136/246 |
| 2016/0301361 A1* | 10/2016 | Shetty .................. H01R 43/005 |
| 2017/0373635 A1 | 12/2017 | Perez et al. |

FOREIGN PATENT DOCUMENTS

| CN | 20364554 | * | 6/2014 |
|---|---|---|---|
| CN | 205755139 | U | 11/2016 |
| CN | 208571937 | U | 3/2019 |
| CN | 209217929 | U | 8/2019 |
| CN | 211791234 | U | 10/2020 |

OTHER PUBLICATIONS

English Language CN20364554 (Year: 2014).*
SUN2000-(175KTL-H0, 185KTL-INHO, 185KTL-H1), User Manual, Version 2.0, Jun. 5, 2019, with an English abstract, total 89 pages.
SUN2000—(110KTL, 125KTL) User Manual, Huawei,Mar. 30, 2020, total 147 pages.
Photos of a Huawei SUN2000-100KTL-M2,total 18 pages.
Screenshot of an installation video (minute 0:59) of the SUN2000—(175KTL-H0, 185KTL-INHO, 185KTL-H1) Installationsvideo,Huawei, Dec. 11, 2020, total 2 pages.
Screenshot of another installation video of the SUN2000—(175KTL-H0, 185KTL-INHO, 185KTL-H1, 196KTL-H0) Series inverter (minute 0:49),Huawei, Oct. 9, 2020,total 2 pages.
Screenshot of yet another installation video of the SUN2000-100KTL-M1 inverter (minute 0:59),Youtube,Jul. 29, 2020, total 1 pages.
Extract from Archive.org of the website renewablewatch.in describing a SUN2000-185KTL-INHO inverter, May 2019, total 4 pages.
Extract from Archive.org of the website saurenergy.com describing a SUN2000-185KTL-INHO inverter, May 2019, total 8 pages.
Photon Special, "Bauteile und Funktionen von Wechselrichtern",2004, total 7 pages.

* cited by examiner

PHOTOVOLTAIC POWER CONVERSION APPARATUS

CROSS-REFERENCE TO RELATED APPLICATIONS

This application is a continuation of International Application No. PCT/CN2021/088724, filed on Apr. 21, 2021, which claims priority to Chinese Patent Application No. 202120550793.X, filed on Mar. 17, 2021. The disclosures of the aforementioned applications are hereby incorporated by reference in their entireties.

TECHNICAL FIELD

This application relates to the field of electrical equipment, and in particular, to a photovoltaic power conversion apparatus.

BACKGROUND

A power conversion apparatus includes a combiner box integrated with a direct-current converter and an inverter device, and is configured to convert a voltage/current into a voltage/current of another type. The power conversion apparatus generally includes a housing and power components disposed in an accommodation cavity formed by the housing. The power components are protected by using the sealed accommodation cavity, to avoid a short circuit failure of the power components caused by rainwater or moisture vapor infiltration into the accommodation cavity.

The power components disposed in the accommodation cavity include power components such as the direct-current converter, an inverter, and a controller, and further include connection components such as a wiring terminal. Because all the power components of the power conversion apparatus are disposed in the accommodation cavity, when the connection components need to be used to perform a wiring operation or other operations, a cavity cover plate of the accommodation cavity of the power conversion apparatus needs to be opened. After the wiring operation is completed, the cavity cover plate further needs to be installed and reset, to seal the accommodation cavity.

However, in actual use, the cavity cover plate may not be installed in place or a sealing structure fails due to repeated installation of the cavity cover plate. As a result, sealing protection cannot be performed on the accommodation cavity, and the short circuit failure of the power components in the accommodation cavity of the power conversion apparatus occurs.

SUMMARY

Embodiments of this application provide a power conversion apparatus, to eliminate a problem that a short circuit failure of power components inside the device occurs because external water vapor enters an accommodation cavity of the device.

An embodiment of this application provides a photovoltaic power conversion apparatus, including a first housing, a power component, at least one second housing, and at least one wiring terminal. The first housing includes a first housing body and a first cover plate, the first housing body and the first cover plate are sealingly connected by using a first sealing connector to form a first accommodation cavity, the first housing body includes a first top wall, a first bottom wall, a back plate wall, and two first side walls, and the first accommodation cavity is a sealed accommodation cavity. The power component is fixedly disposed in the first accommodation cavity. The at least one second housing includes a second housing body and a second cover plate, the second housing body and the second cover plate form a second accommodation cavity, and the second housing body includes a second top wall, a second bottom wall, an installation wall, and two second side walls. A cable inlet/outlet is disposed on the second bottom wall, and is configured to provide an outlet for a power cable of the photovoltaic power conversion apparatus. The at least one second housing is disposed outside a connection area of the first side wall by using the installation wall. The wiring terminal sealingly penetrates through a part of the connection area of the first side wall, a first end of the wiring terminal is located in the first accommodation cavity and is coupled to the power component disposed in the first accommodation cavity, and a second end of the wiring terminal is located in the second accommodation cavity and is configured to connect to the power cable of the photovoltaic power conversion apparatus.

In an embodiment, the connection area is a partial area of the first side wall.

In an embodiment, nut structures are disposed on the first side wall of the first housing, the second housing is fixed on the first housing by using sealing screws, and a sealing cushion is disposed between the second housing and the first housing.

In an embodiment, the second housing body and the second cover plate are sealingly connected by using a second sealing connector, and the second accommodation cavity is a sealed accommodation cavity.

In an embodiment, there are at least two wiring terminals, an insulation blocking plate is disposed between adjacent wiring terminals in the second accommodation cavity, and the insulation blocking plate has a blocking plate extension part extending towards the second bottom wall.

In an embodiment, the wiring terminal sealingly penetrates through a hole area in the connection area, and the hole area is a part that is of the connection area and that is close to the first top wall.

In an embodiment, the photovoltaic power conversion apparatus further includes at least one communication terminal, the communication terminal sealingly penetrates through a part of the connection area of the first side wall, a first end of the communication terminal is located in the first accommodation cavity, and a second end of the communication terminal is located in the second accommodation cavity and is configured to connect a communication cable between the photovoltaic power conversion apparatus and an external device.

In an embodiment, the cable inlet/outlet is formed by a cable outlet hole disposed on the second bottom wall and a cable outlet structure disposed on the cable outlet hole, and the cable outlet structure is detachably disposed at the cable inlet/outlet.

In an embodiment, a fixing structure for fixing a spare cable outlet structure or an accommodation structure for accommodating a spare cable outlet structure is disposed in the second accommodation cavity.

In an embodiment, the cable outlet structure is a sealed cable outlet structure, and the cable inlet/outlet is sealed.

In an embodiment, the spare cable outlet structure is a sealed cable outlet structure.

In an embodiment, the power component is a Si component or a Sic component.

In an embodiment, the photovoltaic power conversion apparatus further includes a power inductor fixedly disposed in the first accommodation cavity, and the first end of the wiring terminal is coupled to the power component by using the power inductor.

In an embodiment, the photovoltaic power conversion apparatus further includes a power component board fixedly disposed in the first accommodation cavity, and the power component board is directly connected to the power component. The first end of the wiring terminal is coupled to the power component by using the power component board.

In an embodiment, the photovoltaic power conversion apparatus further includes a functional board fixedly disposed in the first accommodation cavity, and the first end of the wiring terminal is coupled to the power component by using the functional board.

In an embodiment, the photovoltaic power conversion apparatus further includes a controllable switch disposed in the first accommodation cavity. The controllable switch is fixedly disposed on the functional board, and is configured to maintain or disconnect coupling between the first end of the wiring terminal and the power component. The first end of the wiring terminal is coupled to the power component by using the controllable switch.

In an embodiment, the photovoltaic power conversion apparatus further includes a residual current detection unit disposed in the first accommodation cavity. The residual current detection unit is fixedly disposed on the functional board, and is configured to detect a residual current flowing through the wiring terminal. The first end of the wiring terminal is coupled to the power component by using the residual current detection unit.

In an embodiment, the photovoltaic power conversion apparatus further includes a filter capacitor disposed in the first accommodation cavity. The filter capacitor is fixedly disposed on the power component board and is connected to the power component. Alternatively, the filter capacitor is fixedly disposed on the functional board and is connected to the power inductor.

In an embodiment, the photovoltaic power conversion apparatus further includes a surge protector disposed in the first accommodation cavity. The surge protector is fixedly disposed on the power component board or the functional board, and is configured to protect the photovoltaic power conversion apparatus when a surge voltage occurs.

In an embodiment, the photovoltaic power conversion apparatus further includes an electrolytic capacitor board and an electrolytic capacitor disposed in the first accommodation cavity. The electrolytic capacitor is fixedly disposed on the electrolytic capacitor board, and is configured to provide energy storage for the photovoltaic power conversion apparatus.

In an embodiment, the photovoltaic power conversion apparatus further includes an electromagnetic compatibility capacitor, an electromagnetic compatibility inductor, and/or an electromagnetic compatibility board disposed in the second accommodation cavity. The electromagnetic compatibility capacitor is capable of being fixedly disposed on the electromagnetic compatibility board, and the electromagnetic compatibility inductor is capable of being fixedly disposed on the electromagnetic compatibility board. The electromagnetic compatibility capacitor and the electromagnetic compatibility inductor are configured to provide electromagnetic compatibility filtering for the photovoltaic power conversion apparatus.

In an embodiment, the photovoltaic power conversion apparatus is a direct-current converter, an inverter, an MPPT combiner box, or a direct-current combiner box.

In an embodiment, there are at least two second housings: a first external housing disposed on one of the two first side walls, and a second external housing disposed on the other one of the two first side walls. The first external housing and the second external housing are symmetrically distributed or asymmetrically distributed relative to the first housing.

In an embodiment, the photovoltaic power conversion apparatus includes a first wiring terminal group and a second wiring terminal group. The first wiring terminal group and the second wiring terminal group each include at least one wiring terminal. A first end of the wiring terminal in the first wiring terminal group is located in the first accommodation cavity, and a second end of the wiring terminal in the first wiring terminal group is located in a second accommodation cavity formed by the first external housing. A first end of the wiring terminal in the second wiring terminal group is located in the first accommodation cavity, and a second end of the wiring terminal in the second wiring terminal group is located in a second accommodation cavity formed by the second external housing.

In an embodiment, the second end that is of the wiring terminal and that is located in the second accommodation cavity formed by the first external housing is configured to connect a direct-current cable. The second end that is of the wiring terminal and that is located in the second accommodation cavity formed by the second external housing is configured to connect a power cable.

In an embodiment, the photovoltaic power conversion apparatus further includes at least one pair of input terminals. The input terminal sealingly penetrates through a partial area of the first bottom wall, a first end of the input terminal is coupled to the power component disposed in the first accommodation cavity, and a second end of the input terminal is configured to connect to a photovoltaic string. The photovoltaic string is formed by photovoltaic modules connected in series, connected in parallel, or connected in series and in parallel.

In an embodiment, the photovoltaic power conversion apparatus further includes at least one direct-current switch. The direct-current switch sealingly penetrates through a partial area of the first bottom wall, and an operating part of the direct-current switch is disposed outside the first accommodation cavity. The first end of the input terminal is coupled to the power component by using the direct-current switch.

In an embodiment, the direct-current switch is a trippable direct-current switch.

In an embodiment, the second end of the wiring terminal is configured to connect to an alternating current output cable; or the second end of the wiring terminal is configured to connect to a direct-current output cable.

In an embodiment, a ratio of a total power of the photovoltaic string to a rated total power of the direct-current output cable is greater than 1.2, and the rated total power of the direct-current output cable is a product of a rated voltage and a rated current of the direct-current output cable. Alternatively, a ratio of a total power of the photovoltaic string to a rated total power of the alternating current output cable is greater than 1.2, and the rated total power of the alternating current output cable is a product of a rated voltage and a rated current of the alternating current output cable.

In an embodiment, the second end that is of the wiring terminal and that is located in the second accommodation cavity formed by the first external housing is configured to connect the direct-current cable. The second end that is of the wiring terminal and that is located in the second accommodation cavity formed by the second external housing is configured to connect the alternating current output cable.

In an embodiment, the direct-current cable is configured to connect to an energy storage system.

In an embodiment, a ratio of a total power of the photovoltaic string to a rated total power of the alternating current output cable is greater than 1.2, and the rated total power of the alternating current output cable is a product of a rated voltage and a rated current of the alternating current output cable.

In an embodiment, the photovoltaic power conversion apparatus further includes at least one functional terminal, the functional terminal sealingly penetrates through a partial area of the first bottom wall, or sealingly penetrates through a partial area of an idle side wall, where the idle side wall refers to a first side wall on which no second housing is disposed. A first end of the functional terminal is located in the first accommodation cavity. A second end of the functional terminal is configured to connect a power supply cable of the external device, or configured to connect the communication cable between the photovoltaic power conversion apparatus and the external device.

According to technical solutions provided in the foregoing embodiments, the first accommodation cavity and the second accommodation cavity can form cavities that respectively meet sealing protection requirements, so that components in the first accommodation cavity and the second accommodation cavity can be independently protected. Even if water enters the second accommodation cavity due to poor on-site construction, improper installation of the upper cover plate of the wiring cavity, or the like, the water in the second accommodation cavity cannot enter the first accommodation cavity. Correspondingly, a fault of the first accommodation cavity does not influence the second accommodation cavity, so that fault isolation of the components in the two accommodation cavities can be implemented.

DESCRIPTION OF EMBODIMENTS

The following describes a structure of a power conversion apparatus in this application with reference to accompanying drawings.

The power conversion apparatus may be a photovoltaic power conversion apparatus, for example, a direct-current converter, an inverter, or a combiner box; or may be another power supply equipment having an input/output terminal. The combiner box may include a maximum power point tracking (MPPT) combiner box, a direct-current combiner box, or a combiner box of another type. It should be noted that, for ease of description, the following embodiments mainly use the photovoltaic power conversion apparatus as an example to describe the power conversion apparatus, but this does not mean that technical solutions of this application are limited to the photovoltaic power conversion apparatus.

Figure 1A:
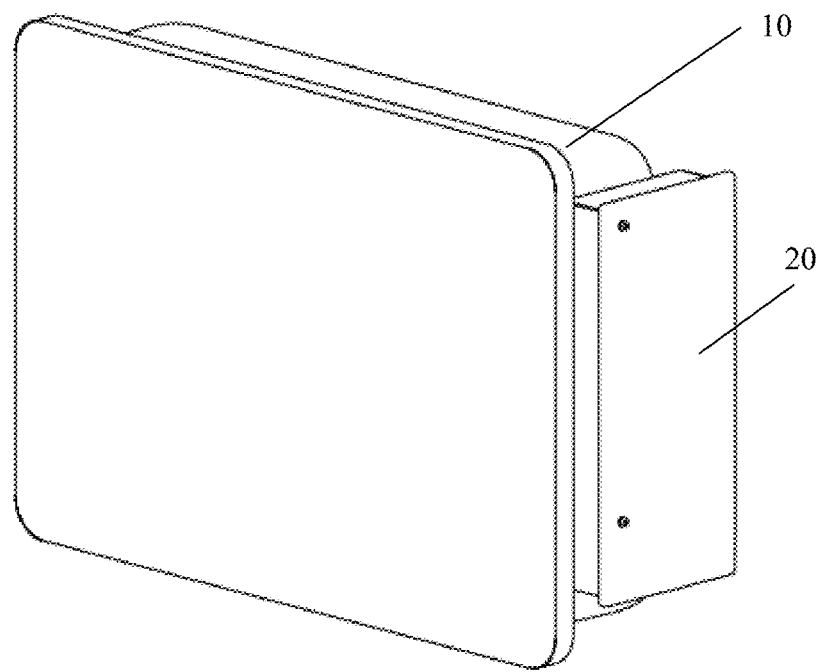
FIG. 1A is a schematic structural diagram of a photovoltaic power conversion apparatus according to an embodiment of this application.
Figure 1B:
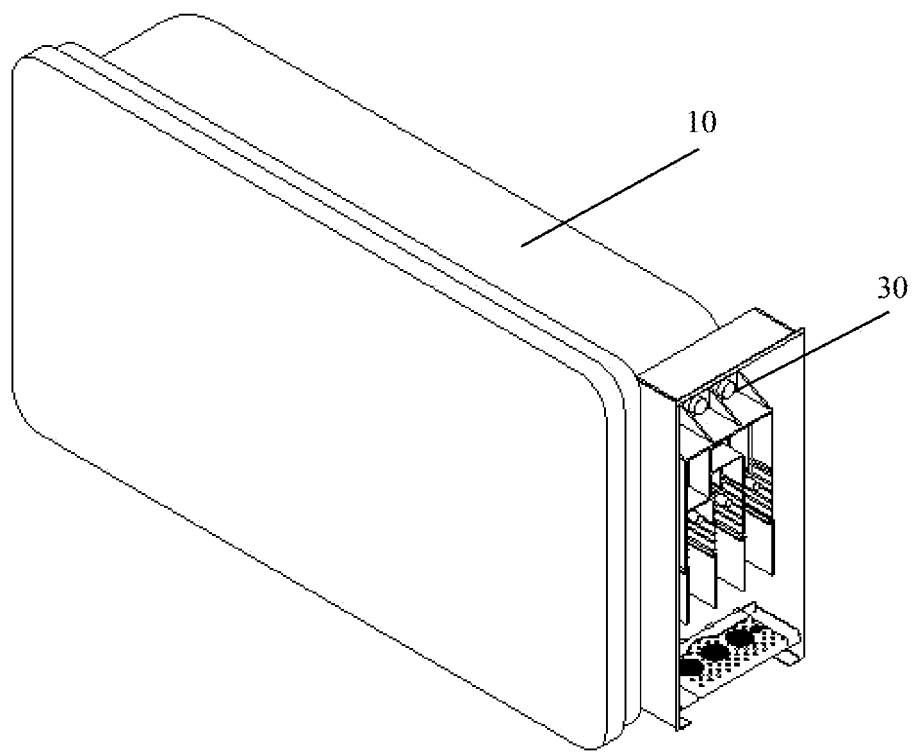
FIG. 1B is a schematic structural diagram of a photovoltaic power conversion apparatus after a second cover plate is removed according to an embodiment of this application.
Figure 1C:
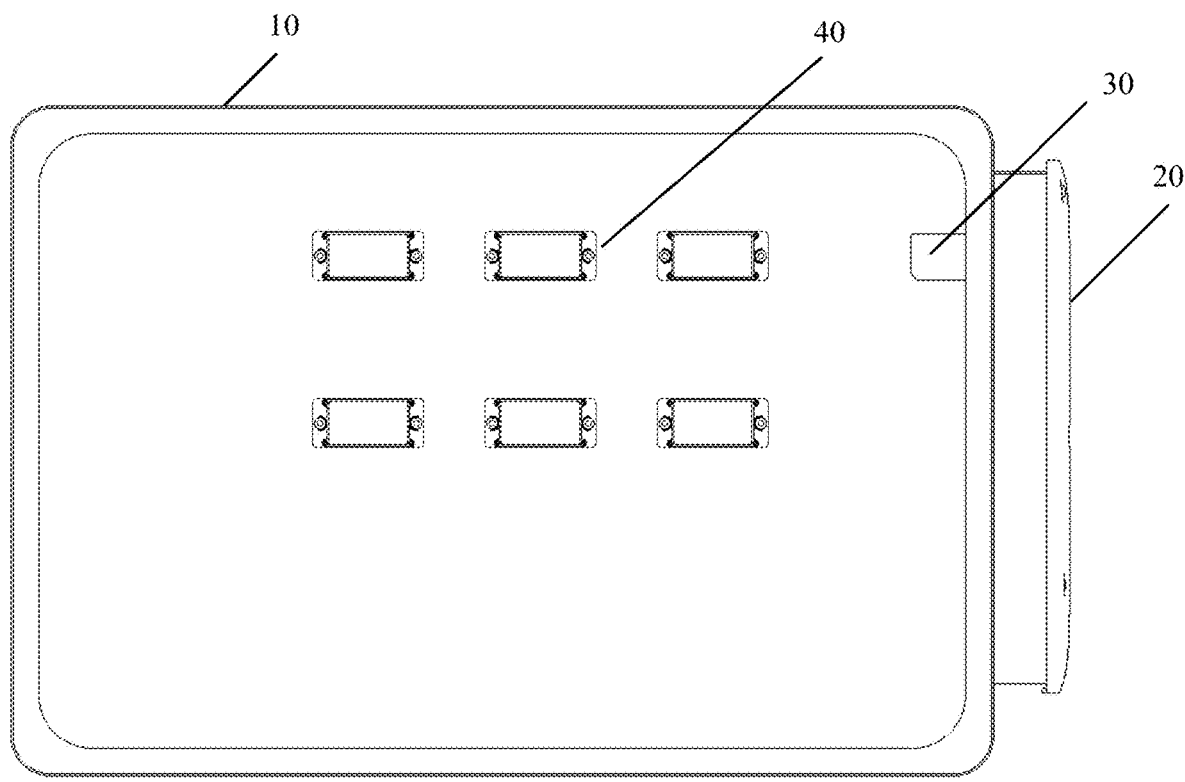
FIG. 1C is a schematic structural diagram of a photovoltaic power conversion apparatus after a first cover plate is removed according to an embodiment of this application.
Figure 1D:
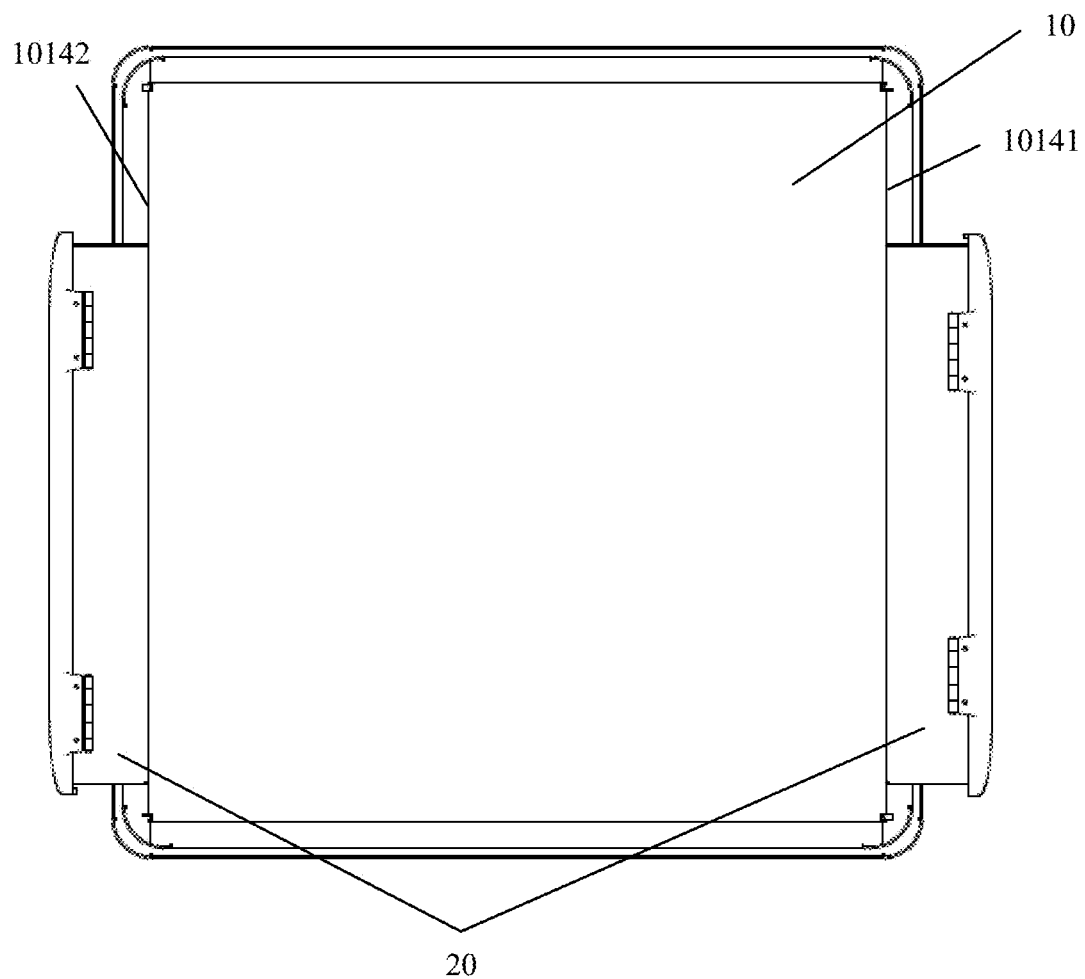
FIG. 1D is a schematic structural diagram of an angle of a photovoltaic power conversion apparatus according to another embodiment of this application.
Figure 1E:
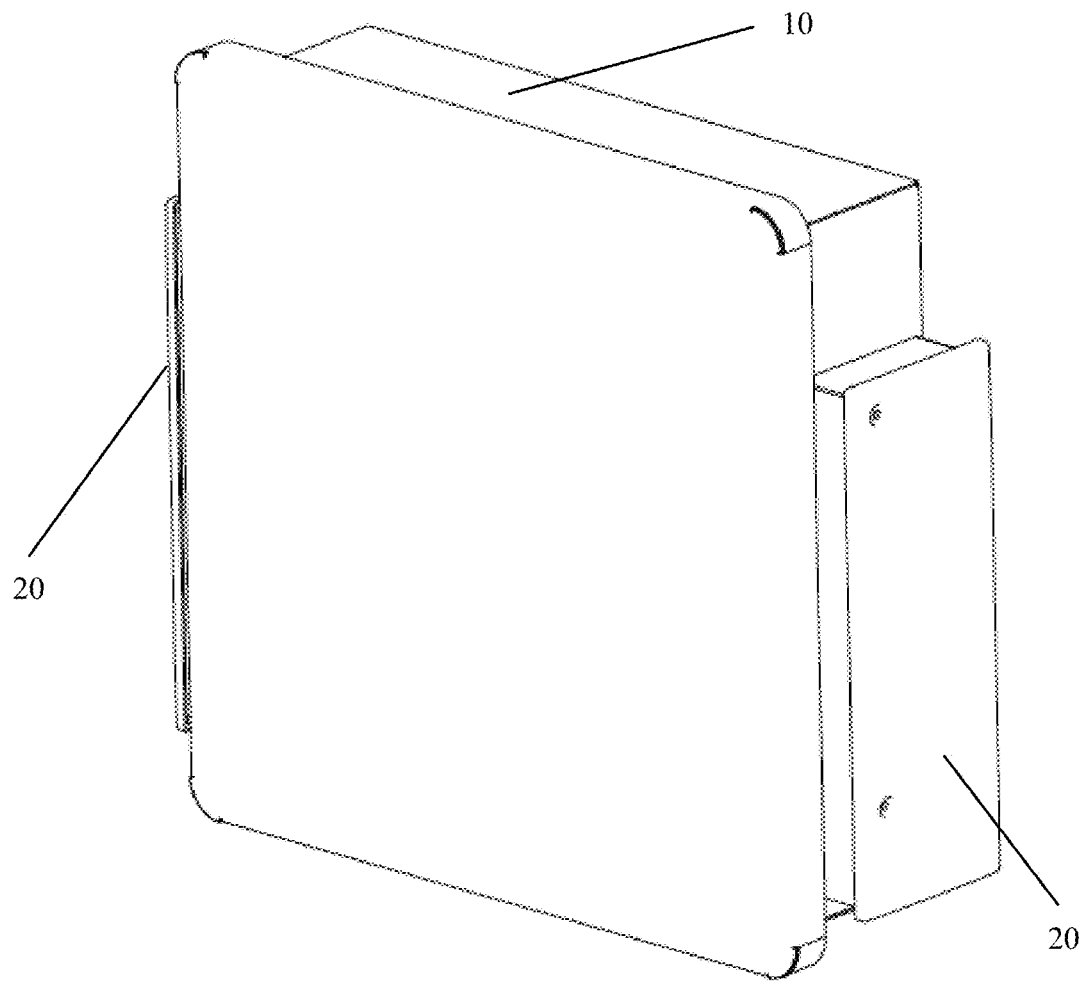
FIG. 1E is a schematic structural diagram of another angle of a photovoltaic power conversion apparatus according to another embodiment of this application.
Figure 1F:
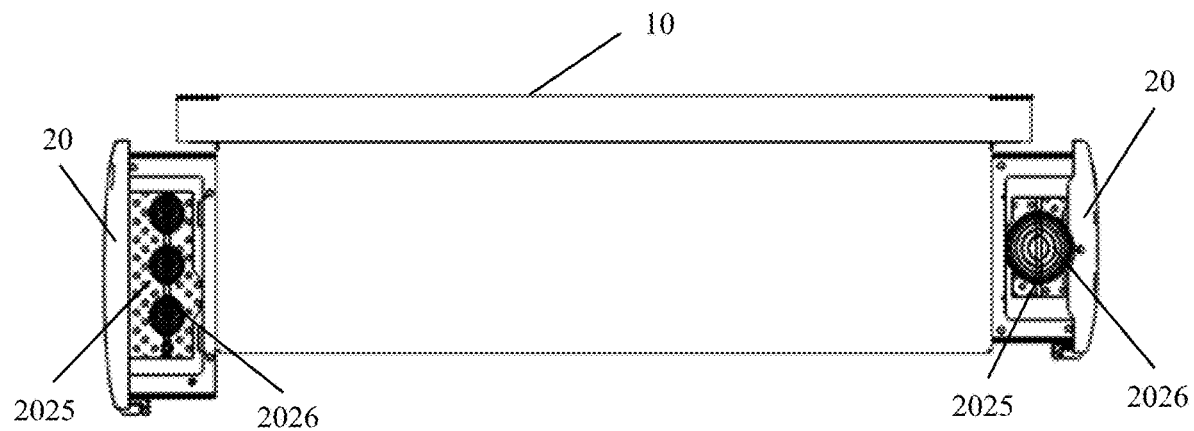
FIG. 1F is a schematic structural diagram of still another angle of a photovoltaic power conversion apparatus according to another embodiment of this application.

As shown in FIG. 1A to FIG. 1C, in an embodiment of this application, the photovoltaic power conversion apparatus may include a first housing 10, a second housing 20, a wiring terminal 30, and a power component 40. There may be only one first housing 10, and there may be one or a plurality of second housings 20, wiring terminals 30, and power components 40. For example, as shown in FIG. 1D to FIG. 1F, the photovoltaic power conversion apparatus may include two second housings. The first housing 10 may also be referred to as a main housing, and the second housing 20 may also be referred to as an external housing.

The first housing 10 may form a first accommodation cavity, and the power component 40 is disposed in the first accommodation cavity. At least one second housing 20 is disposed on the first housing 10 and forms a second accommodation cavity. A cable inlet/outlet 2025 may further be disposed on the second housing 20. The wiring terminal 30 sealingly penetrates through the first housing 10, so that a first end of the wiring terminal 30 is located in the first accommodation cavity and is coupled to the power component 40 disposed in the first accommodation cavity, and a second end of the wiring terminal is located in the second accommodation cavity and is connected to a power cable of the photovoltaic power conversion apparatus.

The first accommodation cavity may be a sealed accommodation cavity that meets a predetermined dustproof and waterproof standard or another protection requirement standard. The second accommodation cavity may be a sealed accommodation cavity, or may be an unsealed accommodation cavity. When there are second housings 20, each of the second housings 20 may form an independent second accommodation cavity. When the second accommodation cavity is the sealed accommodation cavity, a sealing standard of the second accommodation cavity may be the same as or different from a sealing standard of the first accommodation cavity. For example, the first accommodation cavity and the second accommodation cavity may be sealed accommodation cavities that respectively meet different IP (e.g., ingress protection) protection levels. Generally, an IP protection level of the first accommodation cavity is not lower than an IP protection level of the second accommodation cavity.

The following further describes a structure of the first housing of the photovoltaic power conversion apparatus in this application with reference to the accompanying drawings.

In the embodiments of this application, a shape and the structure of the first housing may be set based on a requirement, for example, may be determined based on a space size of an application environment of the photovoltaic power conversion apparatus. The first housing may be in a regular shape or may be in an irregular shape. To facilitate installation of the photovoltaic power conversion apparatus and reduce space required for the installation of the photovoltaic power conversion apparatus, the first housing 10 may be a cuboid or a cuboid having a rounded structure.

Figure 2A:
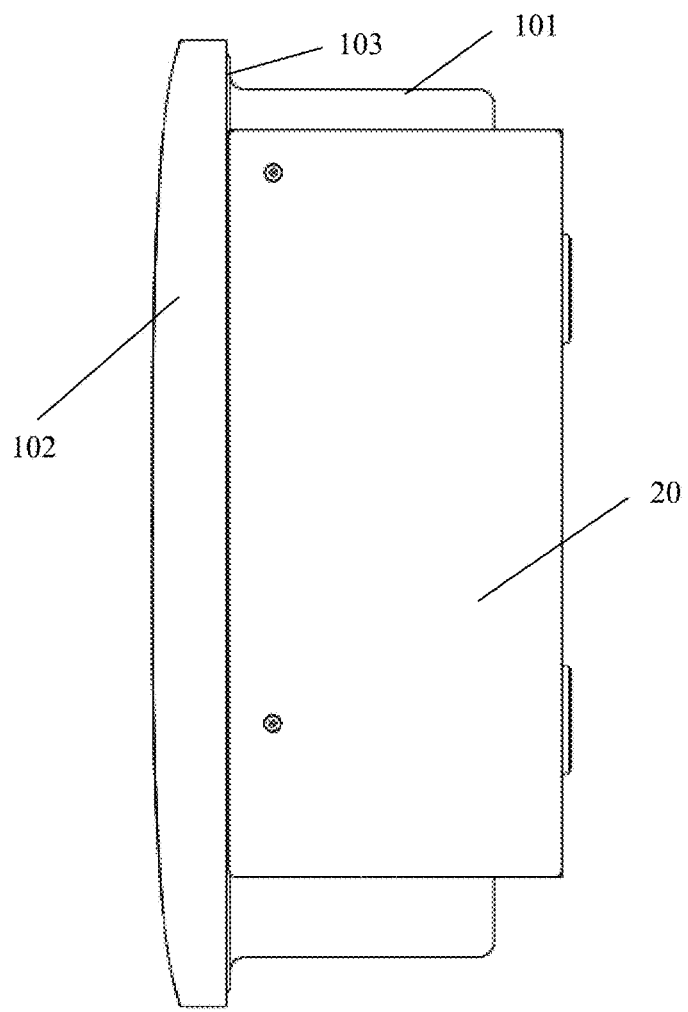
FIG. 2A is a schematic diagram of a position relationship between a first housing and a second housing of a photovoltaic power conversion apparatus according to an embodiment of this application.

For ease of disposing or replacing the power component 40 in the photovoltaic power conversion apparatus, as shown in FIG. 2A, the first housing 10 may include a first housing body 101 and a first cover plate 102, and the first housing body 101 is sealingly connected to the first cover plate 102 to form the first accommodation cavity. The first accommodation cavity is configured to accommodate all or some of the power components 40 of the photovoltaic power conversion apparatus. The first accommodation cavity may be an independent cavity, or may include a plurality of cavities that are communicated with or isolated from each other.

The first housing body 101 and the first cover plate 102 may be detachably connected by using a sealing connector 103, so that the power component 40 can be conveniently placed or taken out on a basis of implementing sealing connection. Alternatively, the first housing body 101 and the first cover plate 102 may be detachably sealed and connected through structural or material cooperation between the first housing body 101 and the first cover plate 102.

Figure 2B:
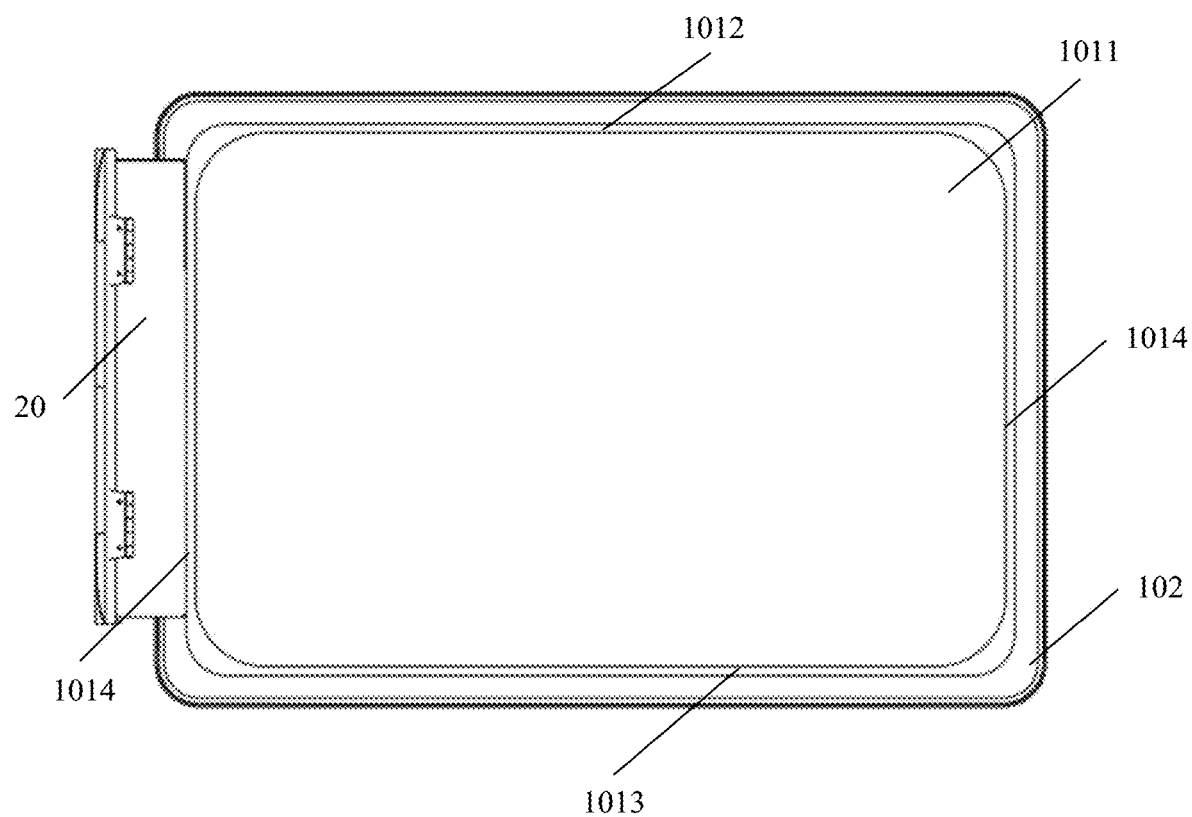
FIG. 2B is a schematic structural diagram of a first housing a photovoltaic power conversion apparatus according to an embodiment of this application.

In an embodiment, as shown in FIG. 2B, the first housing body 101 may be an integrated structure or formed by connecting a plurality of housing walls. The first housing body 101 may include a back plate wall 1011, a first top wall 1012, a first bottom wall 1013, and two first side walls 1014. As shown in FIG. 2B, the back plate wall 1011, the first top wall 1012, the first bottom wall 1013, and the two first side walls 1014 form a concave cavity configured to form the first accommodation cavity. The first cover plate 102 may seal the concave cavity, thereby forming the first accommodation cavity.

The first top wall 1012, the first bottom wall 1013, and the two first side walls 1014 may be independent components, and the components may be connected to the back plate wall 1011 by using sealing connectors or sealing connection materials. In this structure, when the structure of the first housing 10 is relatively complex, processing of the first housing 10 may be facilitated. Alternatively, the first housing body 101 may be an integrated structure including the back plate wall 1011, the first top wall 1012, the first bottom wall 1013, and the two first side walls 1014. In this structure, use of the sealing connector can be reduced, and sealing of the first accommodation cavity can be better implemented. A material of the first housing 10, a connection manner between the parts or the components, and a sealing manner may be determined based on a predetermined sealing standard. This is not limited in this application.

It should be noted that the back plate wall 1011, the first top wall 1012, the first bottom wall 1013, and the two first side walls 1014 are all schematic descriptions for ease of solution description, and do not represent a limitation on the structure of the first housing 10 in this application. This also does not limit an absolute orientation of the first housing 10. For example, the back plate wall 1011 may be a wall that is one of the plurality of housing walls of the first housing 10 and that is configured to install or fix the power component 40, or may be a wall that is one of the plurality of housing walls and that is opposite to the first cover plate 102. The first side walls 1014 refer to two walls that are in the plurality of housing walls and that are perpendicular to the ground after the photovoltaic power conversion apparatus is installed and fixed, or refer to housing walls that are in the plurality of housing walls and that are penetrated through by the wiring terminal 30. For ease of representation, one of the first side walls 1014 may be referred to as a left side wall and the other may be referred to as a right side wall. The first top wall 1012 and the first bottom wall 1013 refer to two walls that are in the plurality of housing walls and that are parallel to the ground after the photovoltaic power conversion apparatus is installed and fixed. A wall relatively far from the ground is the first top wall 1012, and a wall relatively close to the ground is the first bottom wall 1013. The first cover plate 102 is sealingly connected to the first top wall 1012, the first bottom wall 1013, and the two first side walls 1014 separately, to form the first accommodation cavity.

It should be further noted that, in the foregoing embodiments, only an example in which the first housing 10 is the cuboid is used for description, but it does not mean that the first housing 10 can only be the cuboid. In different embodiments, the first housing 10 may alternatively be of a shape, for example, a cylinder, a semi-cylinder, or a ladder. This is not limited in this embodiment of this application. For example, when the first housing 10 is of a semi-cylindrical structure, the first housing body 101 may have an arc-shaped back plate wall, an arc-shaped first top wall, and an arc-shaped first bottom wall. First housings 10 of other shapes are not described herein one by one. For related parts, refer to the foregoing embodiments. In another embodiment, the first housing 10 alternatively includes more or fewer housing walls. A name and a reference of each housing wall may be different from those in the foregoing embodiment. Details are not described herein one by one.

The following further describes a structure of the second housing of the photovoltaic power conversion apparatus in this application with reference to the accompanying drawings. There may be one or a plurality of second housings 20, and shapes and structures of the second housings 20 may be the same or different. The following describes the second housing 20 by using only an example in which the second housing 20 is a cuboid.

Figure 3A:
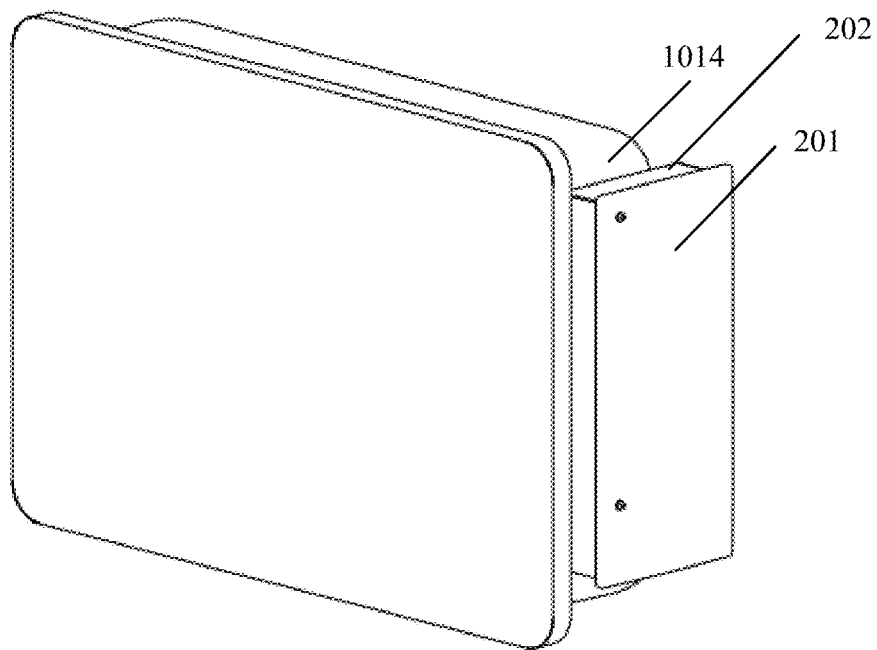
FIG. 3A is a schematic structural diagram of a second housing of a photovoltaic power conversion apparatus according to an embodiment of this application.

As shown in FIG. 3A, the second housing 20 may include a second cover plate 201 and a second housing body 202.

The second housing body 202 may form a concave cavity configured to form a second accommodation cavity. Alternatively, the second housing body 202 and another component (for example, the first side walls 1014) may jointly form the concave cavity configured to form the second accommodation cavity. The second cover plate 201 is configured to cover the concave cavity of the second accommodation cavity, to form the second accommodation cavity. A manner of forming the second accommodation cavity is not limited in this application.

The second cover plate 201 and the second housing body 202 may be connected by using a connector, or may be sealingly connected by using a sealing connector. Alternatively, the second cover plate 201 and the second housing body 202 may be connected or sealingly connected through structural or material cooperation between the second cover plate 201 and the second housing body 202.

Figure 3B:
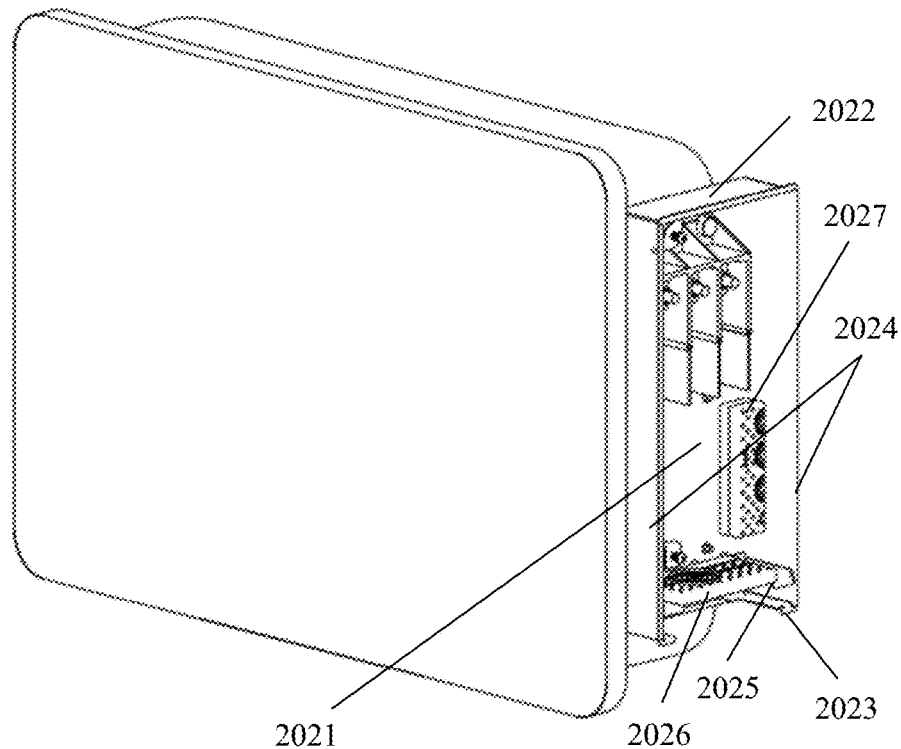
FIG. 3B is a schematic structural diagram of a second housing of a photovoltaic power conversion apparatus after a second cover plate is removed according to an embodiment of this application.

In an embodiment, as shown in FIG. 3B, the second housing body 202 may include an installation wall 2021, a second top wall 2022, a second bottom wall 2023, and two second side walls 2024. The installation wall 2021, the second top wall 2022, the second bottom wall 2023, and the two second side walls 2024 form the concave cavity configured to form the second accommodation cavity. The second housing body 202 and the second cover plate 201 may be connected by using the connector, to form the second accommodation cavity.

In another embodiment, the second housing body 202 may include the second top wall 2022, the second bottom wall 2023, and the two second side walls 2024. The second top wall 2022, the second bottom wall 2023, and the two second side walls 2024 form a cuboid structure, and the second housing body 202 is connected to the second cover plate 201 and one first side wall 1014 of the first housing 10, to form the second accommodation cavity.

Manners of forming the second accommodation cavity vary based on different structures of the second housing body 202.

To accommodate the wiring terminal 30, a depth of the second accommodation cavity formed by the second housing body 202 may be greater than a sum of a height required for the wiring terminal 30 and a height required for wires of the wiring terminal 30. The second cover plate 201 may be of a plate-shaped structure, an arched structure, or another structure, to ensure that the second accommodation cavity has a sufficient space height to accommodate the wiring terminal. This is not limited in this embodiment of this application.

It should be noted that the second housing body 202 may be of an integrated structure, or may be formed by connecting a plurality of components or housing walls. Details are not described one by one in this embodiment of this application. The second top wall 2022, the second bottom wall 2023, and the two second side walls 2024 are also schematic descriptions for ease of solution description, do not represent a limitation on the structure of the second housing 20 in this application, and also do not limit an absolute orientation of the second housing 20. In different embodiments, the second housing may be of a shape, for example, a cuboid, a cylinder, a semi-cylinder, or a ladder. This is not limited in this application.

The following further describes a connection manner between the second housing and the first housing of the photovoltaic power conversion apparatus in this application with reference to the accompanying drawings.

The second housing 20 may be disposed outside a connection area of one housing wall of the first housing 10 in a detachable connection manner. Specific manners in which the second housing 20 is fixed on the first housing 10 vary based on different structures of the second housing. In an embodiment, the installation wall 2021 of the second housing body 202 may be fixed on one housing wall of the first housing body 101, to implement connection between the second housing 20 and the first housing 10. In another embodiment, the second top wall 2022, the second bottom wall 2023, and the two second side walls 2024 of the second housing body 202 may alternatively be fixed on one housing wall of the first housing body 101, to implement connection between the second housing 20 and the first housing 10. In this case, the second housing body 202 may not include the installation wall 2021; and the second cover plate 201, the second top wall 2022, the second bottom wall 2023, and the two second side walls 2024 that are of the second housing body 202 and a connection area of the one housing wall of the first housing body 101 form the second accommodation cavity. The housing wall may be any one of the first side walls 1014, and the connection area of the housing wall is an area in which the first side wall 1014 contacts the installation wall 2021 after the second housing 20 is disposed on the first side wall 1014 of the first housing 10; or an area on the first side wall 1014 that becomes an inner wall of the second accommodation cavity after the second housing 20 is disposed on the first side wall 1014 of the first housing 10.

Based on different actual application scenarios, the second housing 20 may be disposed on different housing walls of the first housing 10 or at different positions on housing walls. Unless otherwise specified below, that the second housing 20 is disposed on the first housing 10 means that the second housing 20 is disposed outside the first side wall 1014 of the first housing 10, in other words, the second housing 20 is disposed outside the first accommodation cavity.

Based on different shapes or volume requirements of the first housing 10 and the second housing 20, an area and a position of the connection area may also be different. For example, the area of the connection area may be less than an area of the installation wall 2021. To be specific, only a part of the installation wall 2021 is attached to or installed on the first housing 10, and another part of the installation wall 2021 is in a suspended state. Alternatively, the area of the connection area may be less than an area of an outer surface of the first side wall 1014, all areas of the installation wall 2021 are attached to or installed on the first housing 10, and an area of the all areas of the installation wall 2021 is less than the area of the outer surface of the first side wall 1014. When there are two or more than two second housings 20, shapes and areas of connection areas corresponding to different second housings 20 may be different. For example, as shown in FIG. 1F, only a partial area of an installation wall 2021 of one second housing 20 is attached to the first side wall 1014, and an installation wall 2021 of the other second housing 20 is fully attached to the first side wall 1014.

When the area of the connection area is less than the area of the outer surface of the first side wall 1014, the connection area may be located in a central area of the outer surface of the first side wall 1014. Alternatively, the connection area may be located at a position that is on the outer surface of the first side wall 1014 and that is close to the first top wall 1012, the first bottom wall 1013, or the back plate wall 1011. Alternatively, the connection area may be all areas of the outer surface of the first side wall 1014, even includes a partial area of the first top wall 1012, the first bottom wall 1013, or the back plate wall 1011. This is not limited in this application.

It should be noted that there may be a plurality of connection manners between the first housing 10 and the second housing 20. Based on different actual application scenarios, a connection structure between the first housing 10 and the second housing 20 may be located in the second accommodation cavity, or may be located outside the second accommodation cavity. The connection structure may be an independent connector, or may be a part of the first housing 10 or the second housing 20. In some embodiments, a sealing component, for example, a sealing cushion or sealing adhesive, may be disposed between the first housing 10 and the second housing 20, to implement sealing connection between the first housing 10 and the second housing 20. In other embodiments, sealing connection may alternatively be implemented through structural or material cooperation of the first housing 10 or the second housing 20. This is not limited in this application.

Figure 3C:
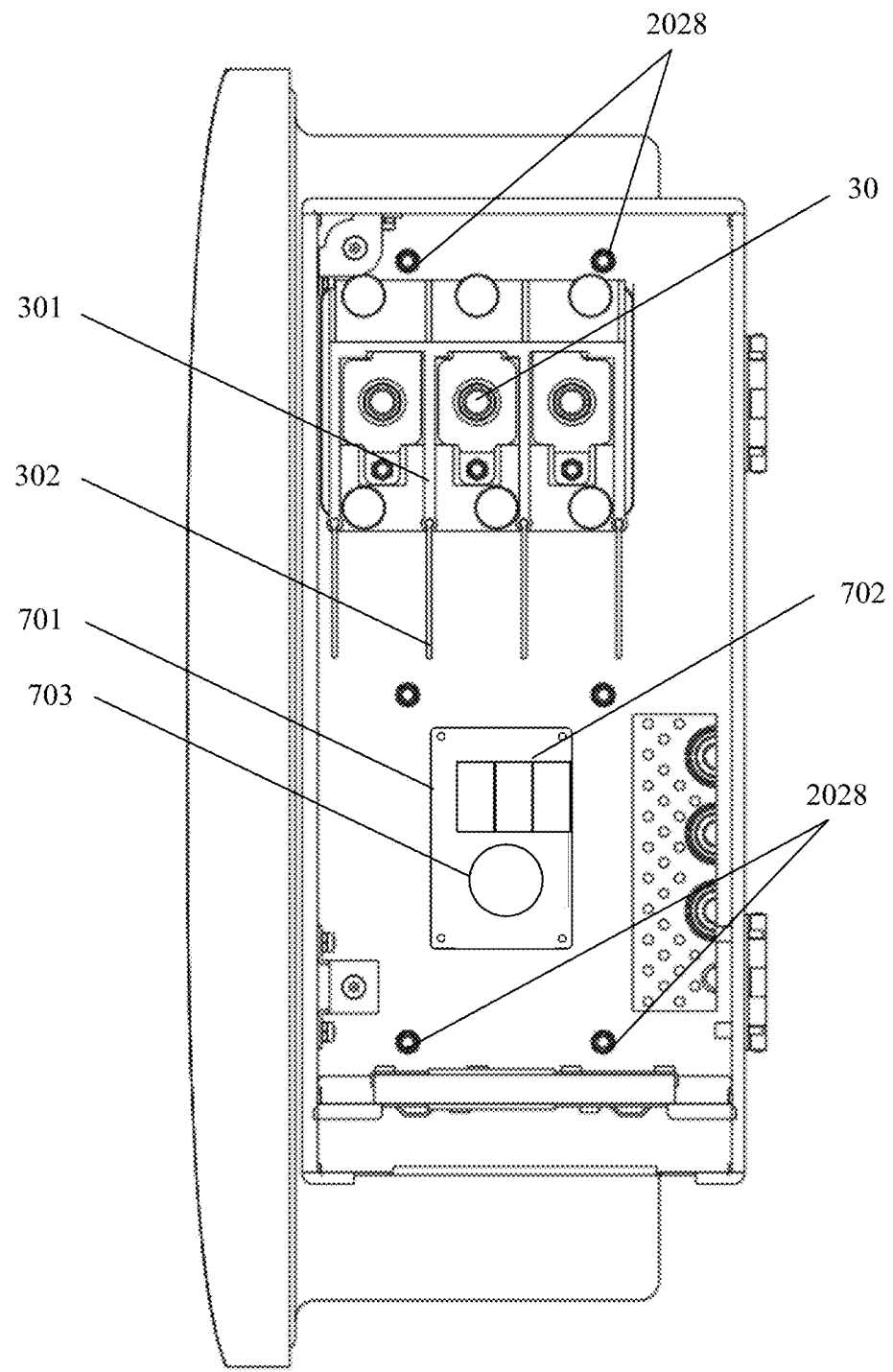
FIG. 3C is a schematic diagram of a manner of disposing a wiring terminal of a photovoltaic power conversion apparatus according to an embodiment of this application.

In an embodiment, as shown in FIG. 3C, a plurality of nut structures may be disposed on the first side wall 1014 of the first housing 10, and the second housing 20 is fixed on the first side wall 1014 by using sealing screws 2028 that penetrate through the installation wall 2021. Alternatively, a clamping structure may be disposed on the first side wall 1014, and a structure corresponding to the clamping structure is disposed on the second housing 20, so that the second housing 20 is fixed on the first side wall 1014 by using the clamping structure. Alternatively, the second housing 20 may be directly bonded to the first side wall 1014. Alternatively, the second housing 20 may be fixed on the first side wall 1014 of the first housing 10 by using the wiring terminal 30. This is not limited in this application.

To facilitate cable outlet of the photovoltaic power conversion apparatus, as shown in FIG. 3B, the cable inlet/outlet 2025 may be further disposed on the second housing 20. The cable inlet/outlet 2025 may be a cable outlet hole or a cable outlet notch disposed on the second housing 20, and is configured to provide an outlet or an inlet for the power cable of the photovoltaic power conversion apparatus. For example, when the second housing 20 includes the second cover plate 201 and the second housing body 202, the cable inlet/outlet 2025 may be disposed on the second housing body 202. A cable outlet direction of the cable inlet/outlet 2025 may be parallel or perpendicular to the connection area. Generally, after the photovoltaic power conversion apparatus is installed and fixed, the cable outlet direction may be perpendicular to the ground, to facilitate cable routing.

There may be one or a plurality of cable inlets/outlets 2025. When there are the plurality of cable inlets/outlets 2025, shapes of the cable inlets/outlets 2025 may be different, to implement cable outlet of different types of cables. The cable inlets/outlets 2025 may alternatively include at least one spare cable inlet/outlet, in other words, a quantity of cable inlets/outlets actually used for cable outlet may be less than a total quantity of cable inlets/outlets.

To implement sealing of the second accommodation cavity, as shown in FIG. 3B, the cable inlet/outlet 2025 may form a sealed cable inlet/outlet in a manner of disposing a sealing cable outlet structure 2026. The sealing cable outlet structure 2026 may be a sealing rubber ring or the like. The sealing cable outlet structure 2026 may still implement sealing of the second accommodation cavity when the cable inlet/outlet 2025 implements cable outlet or is not configured for cable outlet, so that the second accommodation cavity meets the predetermined sealing standard. To meet a requirement of sealing cable outlet of the different types of cables, the sealing cable outlet structure 2026 may be detachably disposed on the cable inlet/outlet 2025, so that the sealing cable outlet structure 2026 may be replaced based on the different types of cables during cable outlet.

A fixing/accommodation structure 2027, for example, a hook or an accommodation cavity, that is used to fix or accommodate a spare component may be further disposed in the second accommodation cavity, so that a spare component including a sealing cable outlet structure (for example, a spare sealing rubber ring) may be conveniently placed in the second accommodation cavity. An electromagnetic compatibility board 701, an electromagnetic compatibility capacitor 702, and/or an electromagnetic compatibility inductor 703 may be further disposed in the second accommodation cavity. The electromagnetic compatibility capacitor 702 may be fixedly disposed on the electromagnetic compatibility board 701. The electromagnetic compatibility inductor 703 may be fixedly disposed on the electromagnetic compatibility board 701. The electromagnetic compatibility board 701 may be fixedly disposed in the second accommodation cavity, for example, fixedly disposed on the installation wall 2021. The electromagnetic compatibility capacitor 702 and the electromagnetic compatibility inductor 703 are configured to provide electromagnetic compatibility filtering for the photovoltaic power conversion apparatus, for example, as shown in FIG. 3C.

In an embodiment of this application, based on different photovoltaic power conversion apparatuses, there may be only one second housing 20, for example, as shown in FIG. 1A; or there may be the plurality of second housings 20, for example, as shown in FIG. 1D. When there are the plurality of second housings 20, the second housings 20 may be separately disposed at different positions of the first housing 10. For example, at least one second housing 20 is disposed on one first side wall 1014 of the first housing 10, and other second housings 20 may be disposed at other positions of the first housing 10. The shapes and the structures of the second housings 20 may be the same or different, and the connection manners between the second housings 20 and the first housing 10 may be the same or different. Details are not described herein again one by one.

For example, as shown in FIG. 1D and FIG. 1E, in an embodiment, the two first side walls 1014 of the first housing body 101 may be respectively referred to as the left side wall and the right side wall; and one second housing 20 may be disposed on the left side wall, and the other second housing 20 is disposed on the right side wall. The second housing disposed on the left side wall may be referred to as a left housing or a first external housing, and the second housing disposed on the right side wall may be referred to as a right housing or a second external housing. The left housing and the right housing may be symmetrically disposed or asymmetrically disposed relative to the first housing 10. In another embodiment, one second housing 20 may be disposed on one first side wall 1014 of the first housing 10, and the other second housing 20 may be disposed on the first top wall 1012 or the first bottom wall 1013 of the first housing 10. In still another embodiment, two or more second housings 20 may be disposed on a same first side wall 1014 of the first housing 10. A specific disposition position of the second housing 20 is not limited in this application. Generally, an area on the first housing 10 except the back plate wall 1011 and the first cover plate 102 may be used to dispose the second housing 20. One second housing 20 or a plurality of second housings 20 may be disposed on a same housing wall.

The following describes a manner of disposing the wiring terminal of the photovoltaic power conversion apparatus in this application with reference to the accompanying drawings. As shown in FIG. 1C and FIG. 3C, the wiring terminal 30 may sealingly penetrates through the first side wall 1014 of the first housing 10 and the installation wall 2021 of the second housing 20 at the same time, so that the first end of the wiring terminal 30 is located in the first accommodation cavity, and the second end of the wiring terminal 30 is located in the second accommodation cavity. When the second housing 20 does not include the installation wall 2021, in other words, when the second housing 20 and the first side wall 1014 form the second accommodation cavity together, the wiring terminal 30 may alternatively only sealingly penetrate through the first side wall 1014, so that the first end of the wiring terminal 30 is located in the first accommodation cavity, and the second end of the wiring terminal 30 is located in the second accommodation cavity.

The first end that is of the wiring terminal 30 and that is located in the first accommodation cavity, namely, the first end of the wiring terminal 30, is coupled to the power component disposed in the first accommodation cavity. The second end that is of the wiring terminal 30 and that is located in second accommodation cavity, namely, the second end of the wiring terminal 30, is configured to connect the power cable of the photovoltaic power conversion apparatus. The power cable may include an alternating current cable, may include a direct-current cable, or may include an output cable and an input cable.

To enable the wiring terminal 30 to penetrate through the first housing 10, in an embodiment, terminal holes extending through the first housing 10 and the second housing 20 may be disposed in some areas in the connection area. A quantity of wiring terminals 30 may vary based on different specific application scenarios. There may be one or a plurality of wiring terminals 30. When there are the plurality of wiring terminals 30, each of the wiring terminals 30 may use a corresponding terminal hole, at least two wiring terminals 30 may share one terminal hole, or all wiring terminals 30 may share one terminal hole. Based on different application scenarios, the terminal hole may be of a rectangle, a circle, an ellipse, or the like. A shape, a size, and a position of the terminal hole are not limited in the embodiments of this application.

To implement sealing of the first accommodation cavity, a corresponding structure or component may be further disposed on the wiring terminal or the terminal hole. In an embodiment, a sealing structure, for example, a sealing ring or the sealing adhesive, may be disposed on the terminal hole, to implement sealing at the terminal hole when the wiring terminal 30 penetrates through the first housing 10, so that the first accommodation cavity and the second accommodation cavity are separated from each other, and spatially not communicate with each other. In this way, the first accommodation cavity and the second accommodation cavity respectively implement the sealing protection standard requirements that the first accommodation cavity and the second accommodation cavity need to meet. In another embodiment, an instillation structure or a fixing structure may be disposed on the wiring terminal 30, and the instillation structure or the fixing structure blocks the terminal hole, thereby implementing sealing at the terminal hole when the wiring terminal 30 sealingly penetrates through the first housing 10. That is, the instillation structure or the fixing structure implements fixing of the wiring terminal 30 and sealing of the terminal hole at the same time.

When there are two or more than two wiring terminals 30, the terminal holes may be arranged in rows, so that the wiring terminals 30 may be arranged in rows as shown in FIG. 3C, to conveniently implement cable connection and cable outlet. To facilitate cable routing of the power cable, a quantity of rows in which the wiring terminals are arranged is usually not more than two. An insulation blocking plate 301 may be further disposed between adjacent wiring terminals 30. The insulation blocking plate 301 may be disposed on the fixing structure of the wiring terminal 30, or may be disposed on the first side wall 1014 of the first housing 10. To implement a better spacing effect, the insulation blocking plate 301 may further extend towards the cable inlet/outlet 2025, to form a blocking plate extension part 302. Alternatively, a connection part of the extension structure 302 may be disposed on the insulation blocking plate 301 to extend the insulation blocking plate 301 based on an actual requirement. In an embodiment, an area in which the terminal hole is located may be referred to as a hole area, and the hole area is a part that is of the connection area and that is close to the first top wall 1012, namely, an upper half part of the first side wall 1014. In other words, the terminal holes may be distributed in the hole area, and the hole area is the part that is of the connection area and that is close to the first top wall 1012, so that after the photovoltaic power conversion apparatus is installed and fixed, the wiring terminal 30 can be as far away from the ground as possible. Therefore, sufficient space is left for implementing cable connection and cable outlet of the photovoltaic power conversion apparatus.

When there are the plurality of second housings, each of the second housings may form an independent second housing cavity, and there may also be a plurality of groups of wiring terminals. First ends of each of the groups of the wiring terminals are located in the first accommodation cavity, and second ends of different groups of wiring terminals are located in different second accommodation cavities. In other words, for each of the second housings, there may be a group of wiring terminals, first ends of the group of wiring terminals are located in the first accommodation cavity, and second ends of the group of wiring terminals are located in the second accommodation cavity formed by the second housing. For example, when the second housing includes the left housing (which may also be referred to as the first external housing) and the right housing (which may also be referred to as the second external housing), there may be at least two groups of wiring terminals. First ends of a first group of wiring terminals in the at least two groups of wiring terminals are located in the first accommodation cavity, and second ends of the first group of wiring terminals in the at least two groups of wiring terminals are located in the second accommodation cavity formed by the left housing. First ends of a second group of wiring terminals in the at least two groups of wiring terminals are also located in the first accommodation cavity, and second ends of the second group of wiring terminals in the at least two groups of wiring terminals are located in the second accommodation cavity formed by the right housing. When there are groups of wiring terminals, each of the groups of wiring terminals may include at least one wiring terminal, and wiring terminals in different groups may be separately configured to implement different functions. For example, power cables connected to the second ends of the first group of wiring terminals are direct-current cables, and power cables connected to the second ends of the second group of wiring terminals are alternating current cables.

Figure 3D:
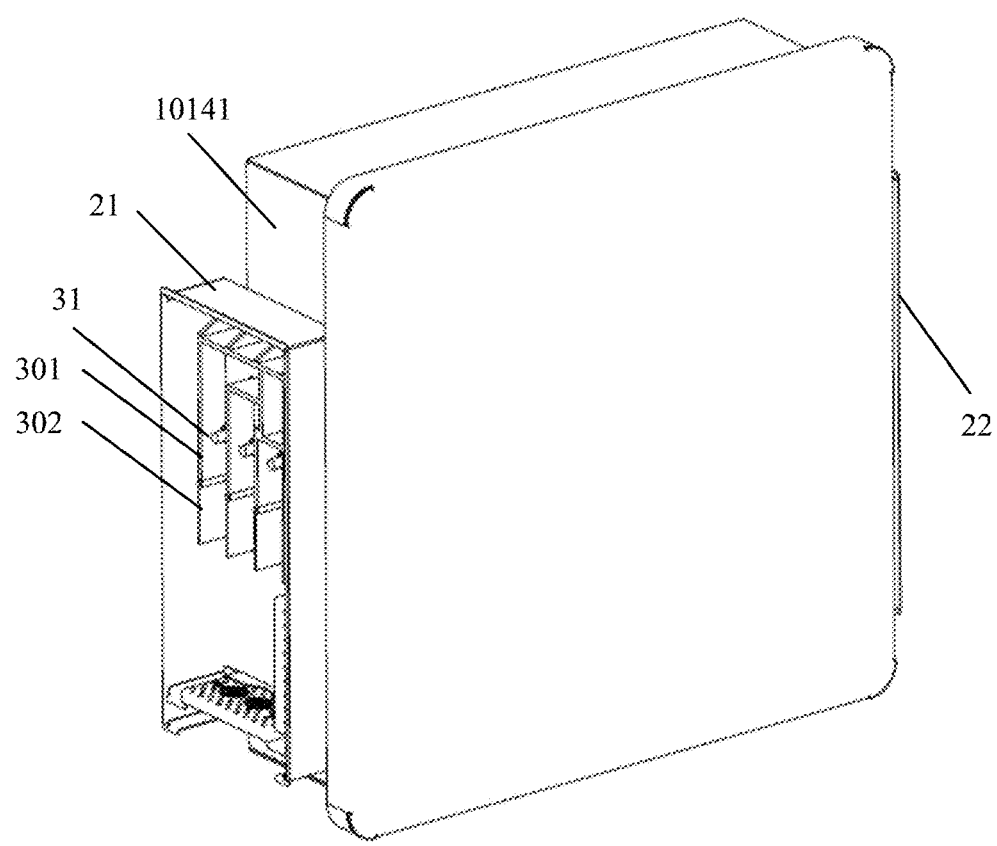
FIG. 3D is a schematic diagram of a manner of disposing a wiring terminal on one side of a photovoltaic power conversion apparatus according to another embodiment of this application.
Figure 3E:
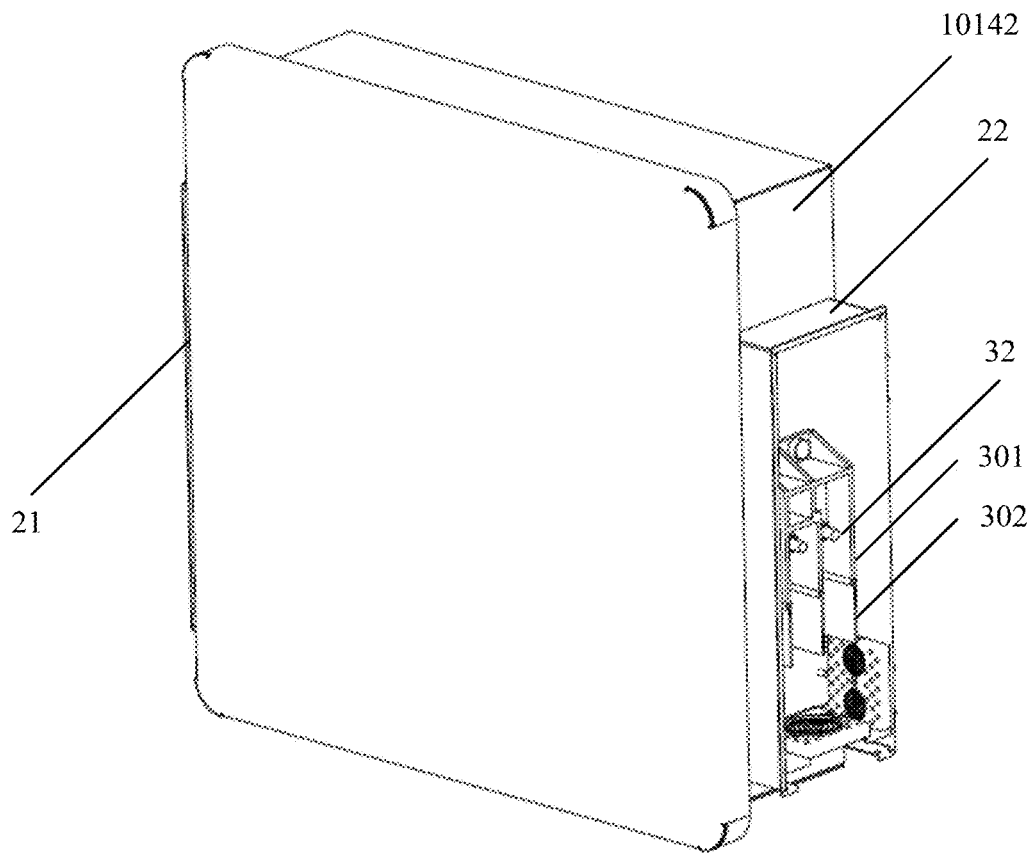
FIG. 3E is a schematic diagram of a manner of disposing a wiring terminal on the other one side of a photovoltaic power conversion apparatus according to another embodiment of this application.

In an embodiment, as shown in FIG. 3D and FIG. 3E, each wiring terminal in a first wiring terminal group 31 (hereinafter referred to as a first group of wiring terminals) may sealingly penetrates through a left side wall 10141, first ends are located in the first accommodation cavity, and second ends are located in a second accommodation cavity formed by a left housing 21. Each wiring terminal in a second wiring terminal group 32 (hereinafter referred to as a second group of wiring terminals) may sealingly penetrates through a right side wall 10142, first ends are located in the first accommodation cavity, and second ends are located in a second accommodation cavity formed by a right housing 22. Insulation blocking plates 301 may be respectively disposed between adjacent wiring terminals in the first group of wiring terminals and between adjacent wiring terminals in the second group of wiring terminals, and each insulation blocking plate 301 may have the blocking plate extension part 302. The second ends in the second accommodation cavity formed by the left housing 21 may be configured to connect direct-current cables, and the second ends in the second accommodation cavity formed by the right housing 22 are configured to connect the direct-current cables or alternating current cables. Alternatively, the second ends in the second accommodation cavity formed by the left housing 21 may be configured to connect the direct-current cables or the alternating current cables, and the second ends in the second accommodation cavity formed by the right housing 22 are configured to connect the direct-current cables.

In addition to the wiring terminal, other types of components, terminals, or components may be further disposed on the photovoltaic power conversion apparatus. A type, a quantity, a disposition position, and the like of the components, the terminals, or the components may also vary based on different photovoltaic power conversion apparatuses or different application scenarios.

In an embodiment, as shown in FIG. 4A to FIG. 4D, the photovoltaic power conversion apparatus may further include at least one pair of input terminals 501. The input terminal 501 may be a direct-current input terminal. The input terminal 501 may sealingly penetrates through the first bottom wall 1013 of the first housing, to be specific, a first end of the input terminal 501 is located in the first accommodation cavity, and a second end of the input terminal 501 is located outside the first accommodation cavity. It should be noted that, the second end of the input terminal 501 may not be located in the second accommodation cavity.

The first end of the input terminal 501 may be coupled to the power component disposed in the first accommodation cavity, and the second end is configured to connect to a photovoltaic string. The photovoltaic string may include photovoltaic modules connected in series, connected in parallel, or connected in series and in parallel. In other words, the photovoltaic string may be formed by the photovoltaic modules connected in series, connected in parallel, or connected in series and in parallel.

Figure 4A:
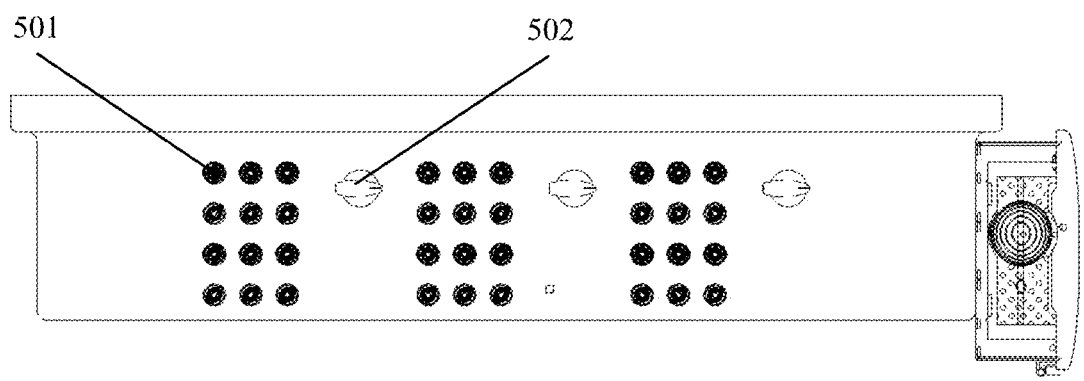
FIG. 4A is a schematic diagram of a manner of disposing an input terminal of a photovoltaic power conversion apparatus according to an embodiment of this application.
Figure 4B:
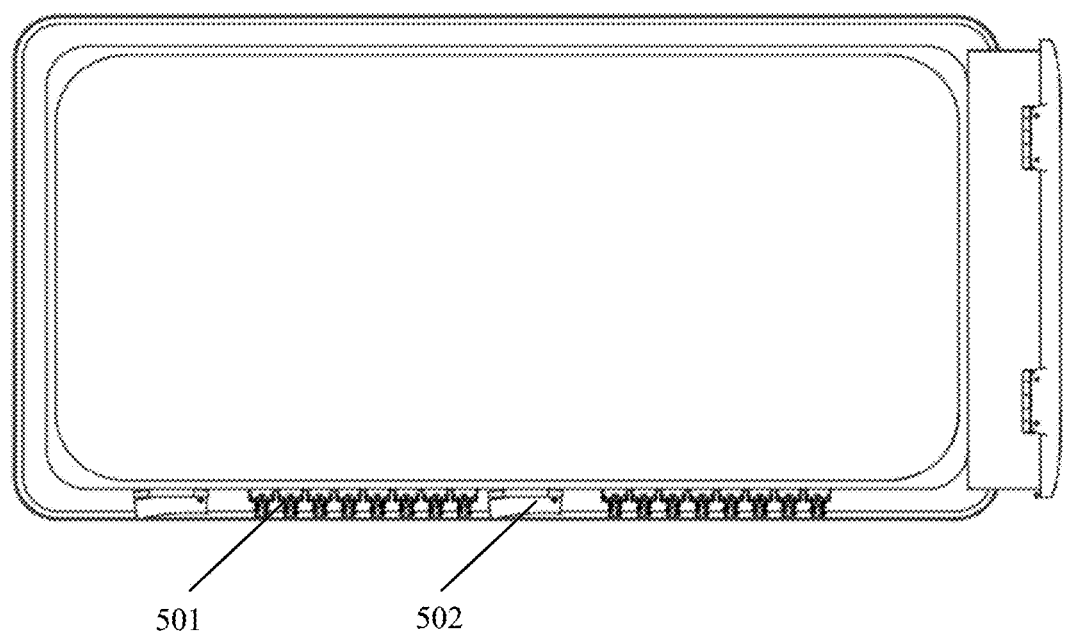
FIG. 4B is another schematic diagram of a manner of disposing an input terminal of a photovoltaic power conversion apparatus according to an embodiment of this application.
Figure 4C:
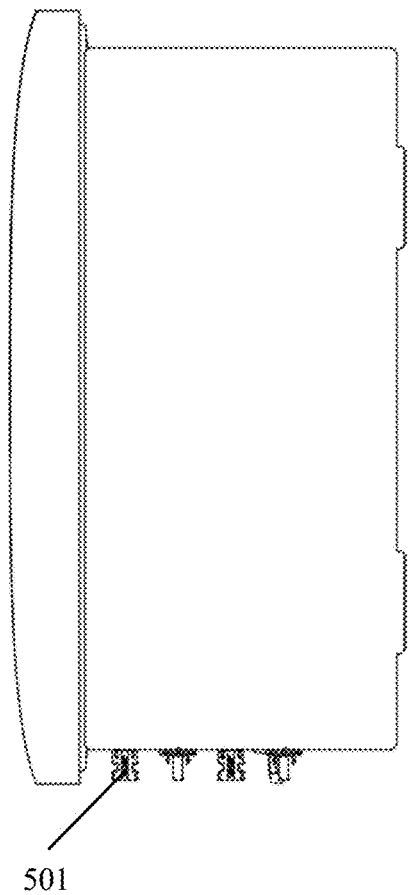
FIG. 4C is still another schematic diagram of a manner of disposing an input terminal of a photovoltaic power conversion apparatus according to an embodiment of this application.
Figure 4D:
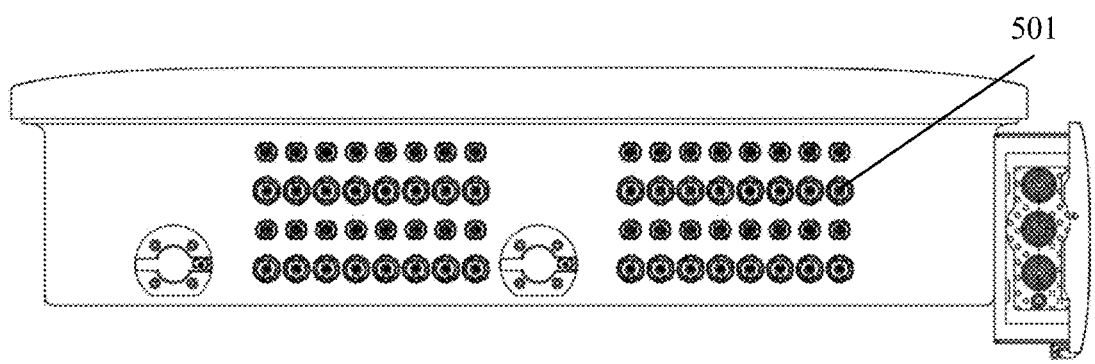
FIG. 4D is yet another schematic diagram of a manner of disposing an input terminal of a photovoltaic power conversion apparatus according to an embodiment of this application.

In addition, as shown in FIG. 4A and FIG. 4B, the photovoltaic power conversion apparatus may further include at least one direct-current switch 502, where the direct-current switch 502 sealingly penetrates through a part of the first bottom wall, and an operating part of the direct-current switch 502 is disposed outside the first accommodation cavity. When the direct-current switch 502 is disposed, the first end of the input terminal 501 may be coupled to the power component by using the direct-current switch, and coupling or disconnection between the input terminal 501 and the power component 40 may be controlled by controlling the direct-current switch. To be specific, the direct-current switch may be configured to control on/off of direct-current input of the input terminal. In actual use, one direct-current switch may be disposed for each of the groups of input terminals, where each of the groups of input terminals may include at least one pair of input terminals, and the direct-current switch may be a trippable direct-current switch.

In another embodiment, the photovoltaic power conversion apparatus may further include at least one functional terminal.

Figure 4E:
FIG. 4E is a schematic diagram of a manner of disposing a functional terminal of a photovoltaic power conversion apparatus according to an embodiment of this application.

As shown in FIG. 4E, a functional terminal 503 sealingly penetrates through a part of the first bottom wall, or sealingly penetrates through a part of the first side wall in which no second housing is disposed. A first end of the functional terminal 503 is located in the first accommodation cavity, and a second end of the functional terminal 503 is connected to different types of cables based on different functions to be implemented by the functional terminal 503. For example, the functional terminal 503 may be configured to connect a power supply cable of an external device, or connect a communication cable between the photovoltaic power conversion apparatus and an external device.

In still another embodiment, the photovoltaic power conversion apparatus may further include at least one communication terminal.

Similar to the wiring terminal, the communication terminal may also sealingly penetrates through a part of the connection area of the first side wall, so that a first end of the communication terminal is located in the first accommodation cavity, and a second end of the communication terminal is located in the second accommodation cavity. Alternatively, a disposition position of the communication terminal may be similar to a disposition position of the functional terminal. Details are not described herein again. The second end of the communication terminal is configured to connect the communication cable between the photovoltaic power conversion apparatus and the external device.

In the embodiments of this application, the power components 40 refer to all or some of power components configured to implement functions of the photovoltaic power conversion apparatus, for example, the direct-current converter or the inverter. Based on different photovoltaic power conversion apparatuses, circuit elements included in the power component 40 may also be different. A type or a structure that is of the power component 40, or the circuit element included in the power component 40 is not limited in the embodiments of this application. For example, the power component 40 may include a Si component, a Sic component, or another component that is sensitive to a humidity change.

The power component 40 may be disposed in the first accommodation cavity formed by the first housing 10. Manners of disposing the power component 40 in the first accommodation cavity vary based on different types or different structures of the power component 40. For example, the power component 40 may be directly or indirectly fixed on the back plate wall 1011 of the first housing 10, or may be directly or indirectly fixed on the first top wall 1012, the first bottom wall 1013, or the first side wall 1014 of the first housing 10.

In addition to the power component 40, another structure, component, circuit, or apparatus may be further disposed or formed in the first accommodation cavity, to implement various functions to be implemented by the photovoltaic power conversion apparatus.

In an embodiment, a power inductor 603 may be further fixedly disposed in the first accommodation cavity. The first end of the wiring terminal may be coupled to the power component 40 by using the power inductor 603.

In an embodiment, a board may be further disposed in the first accommodation cavity. There may be one or more boards, and each board may be fixed on each of the housing walls of the first housing 10, for example, may be fixed on the back plate wall 1011. A same board and components disposed on the board may be used to implement only a same function, or may be separately configured to implement different functions. Correspondingly, different boards may be separately configured to implement different functions, or may be configured to implement a same function. Based on different functions to be implemented, the board disposed in the first accommodation cavity may include one or more of a power component board, a functional board, or an electrolytic capacitor board.

Figure 5A:
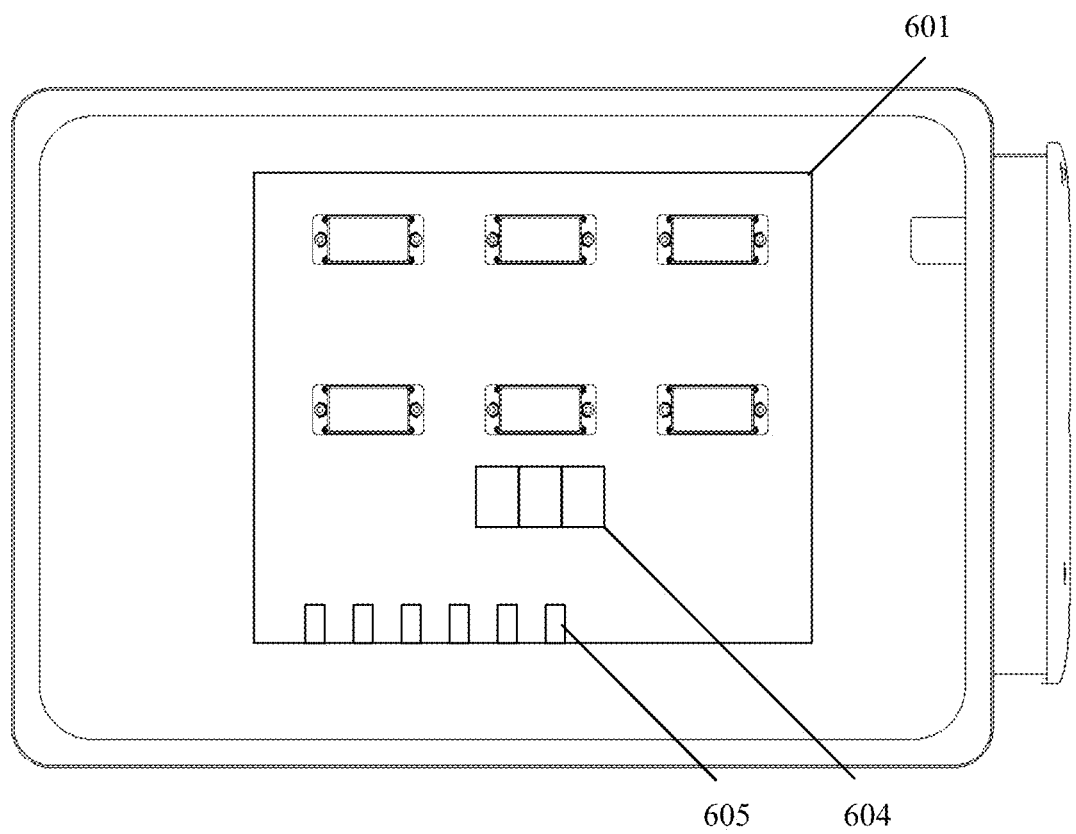
FIG. 5A is a schematic diagram of a manner of disposing a board of a photovoltaic power conversion apparatus according to an embodiment of this application.

In an embodiment, as shown in FIG. 5A, a power component board 601 may be disposed in the first accommodation cavity, and the power component 40 may be directly connected to the power component board 601. For example, the power component may be directly disposed on the power component board 601, or the power component board 601 may be directly formed by a substrate and the power component 40 disposed on the substrate. The first end of the wiring terminal may be coupled to the power component by using the power component board.

A filter capacitor 604 may be further disposed in the first accommodation cavity. The filter capacitor 604 may be fixedly disposed on the power component board 601, and is connected to the power component 40. A surge protector 605 may be further disposed in the first accommodation cavity. The surge protector 605 may also be fixedly disposed on the power component board 601, and is configured to protect the photovoltaic power conversion apparatus when a surge voltage occurs.

Figure 5B:
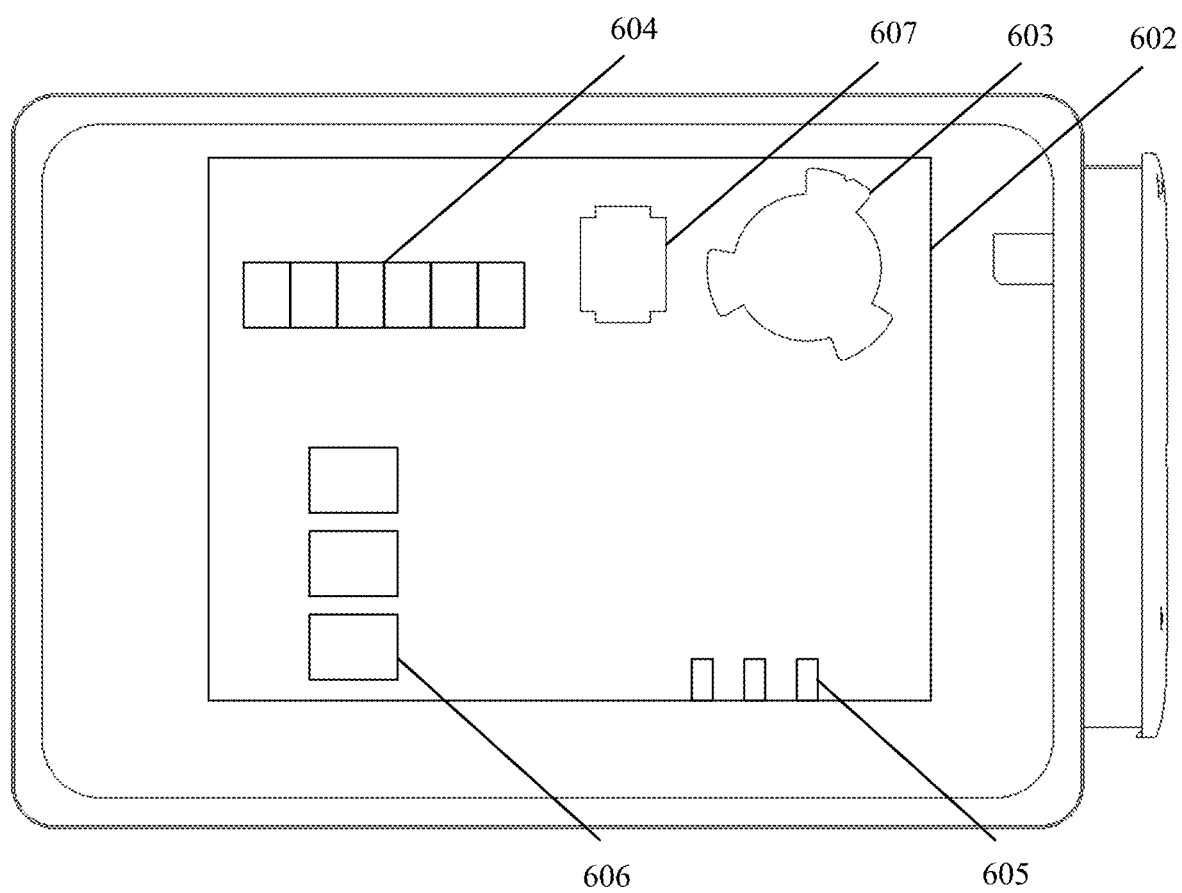
FIG. 5B is another schematic diagram of a manner of disposing a board of a photovoltaic power conversion apparatus according to an embodiment of this application.

In another embodiment, as shown in FIG. 5B, a functional board 602 may be disposed in the first accommodation cavity, and the first end of the wiring terminal may be coupled to the power component 40 by using the functional board 602.

The power inductor 603 may be further disposed in the first accommodation cavity, and the power inductor 603 may be fixedly disposed on the functional board 602. The first end of the wiring terminal may be further coupled to the power component 40 by using the power inductor 603. The filter capacitor 604 may be further disposed in the first accommodation cavity. The filter capacitor 604 may be fixedly disposed on the functional board, and is connected to the power inductor 603. The surge protector 605 may be further disposed in the first accommodation cavity. The surge protector 605 may be fixedly disposed on the functional board 602, and is configured to protect the photovoltaic power conversion apparatus when the surge voltage occurs.

A controllable switch 606 may be further disposed in the first accommodation cavity, and the controllable switch 606 may be fixedly disposed on the functional board 602. The first end of the wiring terminal may be coupled to the power component 40 by using the controllable switch 606, and the controllable switch 606 may be configured to maintain or disconnect coupling between the first end of the wiring terminal and the power component 40.

A residual current detection unit 607 may be further disposed in the first accommodation cavity, and the residual current detection unit 607 may be fixedly disposed on the functional board 602. The first end of the wiring terminal is coupled to the power component 40 by using the residual current detection unit 607. The residual current detection unit 607 is configured to detect a residual current flowing through the wiring terminal.

Figure 5C:
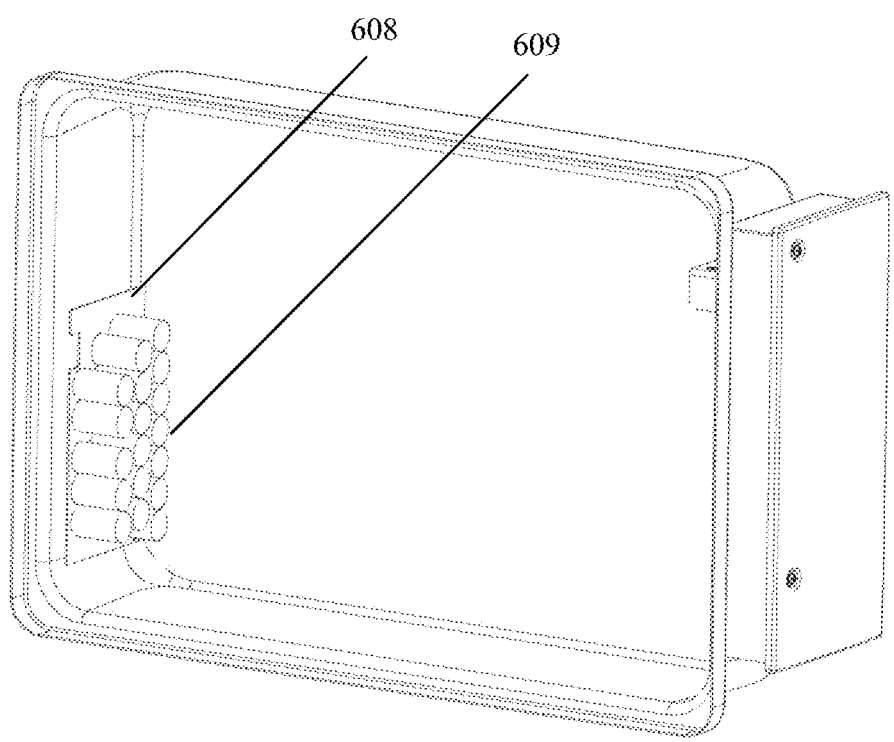
FIG. 5C is still another schematic diagram of a manner of disposing a board of a photovoltaic power conversion apparatus according to an embodiment of this application.

In still another embodiment, as shown in FIG. 5C, an electrolytic capacitor board 608 and an electrolytic capacitor 609 may be disposed in the first accommodation cavity. The electrolytic capacitor 609 may be fixedly disposed on the electrolytic capacitor board 608, and is configured to provide energy storage for the photovoltaic power conversion apparatus.

It should be noted that, in the embodiments of this application, the quantity of second housings 20 and a quantity of various types of terminals that are disposed on the first housing 10 may be different based on different actual product requirements. The following describes several example structures of the photovoltaic power conversion apparatus in the embodiments of this application with reference to the accompanying drawings.

When the photovoltaic power conversion apparatus is a single-level inverter or the direct-current converter, the photovoltaic power conversion apparatus may include two second housings, and may not include the input terminal. In other words, the two second housings and two groups of wiring terminals are disposed on the first housing, and no input terminal is disposed. One of the two second housings (namely, the left housing) is disposed on the left side wall of the first housing, and the other one (namely, the right housing) is disposed on the right side wall. The second ends in the second accommodation cavity formed by the left housing are configured to connect the direct-current input cables, and the second ends in the second accommodation cavity formed by the right housing are configured to connect the alternating current output cables or the direct-current output cables. Alternatively, the second ends of the wiring terminals located in the second accommodation cavity formed by the left housing are configured to connect the alternating current output cables or the direct-current output cables, and the second ends of the wiring terminals located in the second accommodation cavity formed by the right housing are configured to connect the direct-current input cables. In this case, an external structure of the photovoltaic power conversion apparatus may be shown in FIG. 1D to FIG. 1F, the structure of the second housing may be shown in FIG. 3D and FIG. 3E, and the manner of disposing the wiring terminal may be shown in FIG. 3C. Details are not described herein again.

When the photovoltaic power conversion apparatus is an inverter, the direct-current combiner box, or the MPPT combiner box, the photovoltaic power conversion apparatus may include one second housing and at least one group of input terminals. In other words, the one second housing and one group of wiring terminals are disposed on the first housing, and the at least one group of input terminals is disposed. The second housing may be disposed on any first side wall of the first housing, the input terminal may be disposed on the first bottom wall of the first housing, the first end of the input terminal may be coupled to the power component disposed in the first accommodation cavity, and the second end is configured to connect to the photovoltaic string. The second ends that are of the wiring terminals and that are located in the second accommodation cavity formed by the second housing may be configured to connect the alternating current output cables or the direct-current output cables. A ratio of a total power of the photovoltaic string to a rated total power of the direct-current output cable is greater than 1.2, and the rated total power of the direct-current output cable is a product of a rated voltage and a rated current of the direct-current output cable. Alternatively, a ratio of a total power of the photovoltaic string to a rated total power of the alternating current output cable is greater than 1.2, and the rated total power of the alternating current output cable is a product of a rated voltage and a rated current of the alternating current output cable. The structure of the second housing may be shown in FIG. 3B and FIG. 3C, and details are not described herein again.

When the photovoltaic power conversion apparatus is the inverter, the photovoltaic power conversion apparatus may include two second housings, and include at least one group of input terminals. One of the two second housings (namely, the left housing) is disposed on the left side wall of the first housing, and the other one (namely, the right housing) is disposed on the right side wall. The second ends in the second accommodation cavity formed by the left housing may be configured to connect the direct-current cables, and the second ends in the second accommodation cavity formed by the right housing are configured to connect the alternating current output cables. Alternatively, the second ends of the wiring terminals in the second accommodation cavity formed by the left housing are configured to connect the alternating current output cables, and the second ends of the wiring terminals in the second accommodation cavity formed by the right housing are configured to connect the direct-current cables. The input terminal may be disposed on the first bottom wall of the first housing, the first end of the input terminal may be coupled to the power component disposed in the first accommodation cavity, and the second end is configured to connect to the photovoltaic string. Other structures are not described herein again.

It should be noted that the foregoing embodiments are merely used to describe differences between different photovoltaic power conversion apparatuses. For similarities of the different photovoltaic power conversion apparatuses (for example, the structure of the first housing or the structure of the second housing; and the manners of disposing the wiring terminal, the functional terminal, and the communication terminal), refer to other embodiments. Details are not described herein again.

According to the technical solution provided in the foregoing embodiments, the first accommodation cavity and the second accommodation cavity can form the cavities that respectively meet the sealing protection requirements, so that the components in the first accommodation cavity and the second accommodation cavity can be independently protected. Even if water enters the second accommodation cavity due to poor on-site construction, improper installation of the upper cover plate of the wiring cavity, or the like, the water in the second accommodation cavity cannot enter the first accommodation cavity. Correspondingly, a fault of the first accommodation cavity does not spread to the second accommodation cavity, so that fault isolation of the components in the two accommodation cavities can be implemented.

The foregoing descriptions are merely specific embodiments of this application, but are not intended to limit the protection scope of this application. Any variation or replacement within the technical scope disclosed in this application shall fall within the protection scope of this application. Therefore, the protection scope of this application shall be subject to the protection scope of the claims.

What is claimed is:

1. A photovoltaic power conversion apparatus, comprising:
   a first housing comprising a first housing body and a first cover plate sealingly connected using a first sealing connector to form a first accommodation cavity, wherein the first housing body and the first cover plate are detachably connected by using the first sealing connector, so that a power component can be placed or taken out on a basis of implementing sealing connection, wherein the first housing body comprises a first top wall, a first bottom wall, a back plate wall, and two first side walls, and wherein the first accommodation cavity is a sealed accommodation cavity;
   the power component fixedly disposed in the first accommodation cavity;
   a second housing disposed outside a connection area of the first side wall by using an installation wall, the second housing comprising a second housing body and a second cover plate to form a second accommodation cavity, wherein the second housing body comprises a second top wall, a second bottom wall having a cable inlet/outlet disposed thereon, the installation wall, and two second side walls; and
   a wiring terminal sealingly penetrated through a part of the connection area of the first side wall, wherein a first end of the wiring terminal is located in the first accommodation cavity and is coupled to the power component disposed in the first accommodation cavity, and wherein a second end of the wiring terminal is located in the second accommodation cavity and is configured to be connected to a power cable of the photovoltaic power conversion apparatus; and
   at least two wiring terminals, wherein an insulation blocking plate is disposed between adjacent wiring terminals in the second accommodation cavity, and wherein the insulation blocking plate includes a blocking plate extension part extending towards the second bottom wall.

2. The photovoltaic power conversion apparatus according to claim 1, wherein
   the connection area is a partial area of the first side wall.

3. The photovoltaic power conversion apparatus according to claim 1, wherein
   a plurality of nut structures are disposed on the first side wall of the first housing, the second housing is fixed on the first housing by using sealing screws, and a sealing cushion is disposed between the second housing and the first housing.

4. The photovoltaic power conversion apparatus according to claim 1, wherein
the second housing body and the second cover plate are sealingly connected by using a second sealing connector, and the second accommodation cavity is a sealed accommodation cavity.

5. The photovoltaic power conversion apparatus according to claim 1, wherein
the wiring terminal sealingly penetrates through a hole area in the connection area, and the hole area is a part that is of the connection area and that is close to the first top wall.

6. The photovoltaic power conversion apparatus according to claim 1, further comprising at least one communication terminal, wherein the communication terminal sealingly penetrates through a part of the connection area of the first side wall, a first end of the communication terminal is located in the first accommodation cavity, and a second end of the communication terminal is located in the second accommodation cavity and is configured to connect a communication cable between the photovoltaic power conversion apparatus and an external device.

7. The photovoltaic power conversion apparatus according to claim 1, wherein
the cable inlet/outlet is formed by a cable outlet hole disposed on the second bottom wall and a cable outlet structure disposed on the cable outlet hole, and the cable outlet structure is detachably disposed at the cable inlet/outlet.

8. The photovoltaic power conversion apparatus according to claim 7, wherein
the cable outlet structure is a sealed cable outlet structure, and the cable inlet/outlet is sealed.

9. The photovoltaic power conversion apparatus according to claim 1, wherein
a fixing structure for fixing a spare cable outlet structure or an accommodation structure for accommodating a spare cable outlet structure is disposed in the second accommodation cavity.

10. The photovoltaic power conversion apparatus according to claim 1, further comprising a power component board fixedly disposed in the first accommodation cavity, wherein
the power component board is directly connected to the power component, and
the first end of the wiring terminal is coupled to the power component by using the power component board.

11. The photovoltaic power conversion apparatus according to claim 10, further comprising a filter capacitor disposed in the first accommodation cavity,
wherein the filter capacitor is fixedly disposed on the power component board and is connected to the power component; or the filter capacitor is fixedly disposed on a functional board and is connected to a power inductor.

12. The photovoltaic power conversion apparatus according to claim 10, further comprising a surge protector disposed in the first accommodation cavity,
wherein the surge protector is fixedly disposed on the power component board or a functional board, and is configured to protect the photovoltaic power conversion apparatus when a surge voltage occurs.

13. The photovoltaic power conversion apparatus according to claim 1, further comprising a functional board fixedly disposed in the first accommodation cavity,
wherein the first end of the wiring terminal is coupled to the power component by using the functional board.

14. The photovoltaic power conversion apparatus according to claim 13, further comprising a residual current detection unit disposed in the first accommodation cavity, wherein
the residual current detection unit is fixedly disposed on the functional board, and is configured to detect a residual current flowing through the wiring terminal, and
the first end of the wiring terminal is coupled to the power component by using the residual current detection unit.

15. The photovoltaic power conversion apparatus according to claim 1, further comprising an electrolytic capacitor board and an electrolytic capacitor disposed in the first accommodation cavity,
wherein the electrolytic capacitor is fixedly disposed on the electrolytic capacitor board, and is configured to provide energy storage for the photovoltaic power conversion apparatus.

16. The photovoltaic power conversion apparatus according to claim 1, further comprising an electromagnetic compatibility capacitor, an electromagnetic compatibility inductor, and an electromagnetic compatibility board disposed in the second accommodation cavity,
wherein the electromagnetic compatibility capacitor is capable of being fixedly disposed on the electromagnetic compatibility board, the electromagnetic compatibility inductor is capable of being fixedly disposed on the electromagnetic compatibility board, and the electromagnetic compatibility capacitor and the electromagnetic compatibility inductor are configured to provide electromagnetic compatibility filtering for the photovoltaic power conversion apparatus.

17. The photovoltaic power conversion apparatus according to claim 1, wherein
the photovoltaic power conversion apparatus is an inverter, an MPPT combiner box, a direct-current combiner box, or a direct-current converter.

18. The photovoltaic power conversion apparatus according to claim 1, wherein the second housing comprises a first external housing disposed on one of the two first side walls and a second external housing disposed on the other one of the two first side walls,
wherein the first external housing and the second external housing are symmetrically distributed or asymmetrically distributed relative to the first housing.

19. The photovoltaic power conversion apparatus according to claim 18, further comprising a first wiring terminal group and a second wiring terminal group, wherein
a first end of a first wiring terminal in the first wiring terminal group is located in the first accommodation cavity, and a second end of the first wiring terminal is located in a second accommodation cavity formed by the first external housing; and
a first end of a second wiring terminal in the second wiring terminal group is located in the first accommodation cavity, and a second end of the second wiring terminal is located in a second accommodation cavity formed by the second external housing.

20. The photovoltaic power conversion apparatus according to claim 19, wherein
the second end of the first wiring terminal is configured to be connected to a direct-current cable; and
the second end of the second wiring terminal is configured to be connected to the direct-current cable or an alternating current cable.

21. The photovoltaic power conversion apparatus according to claim 1, further comprising at least one pair of input terminals, wherein the input terminal sealingly penetrates through a partial area of the first bottom wall, a first end of the input terminal is coupled to the power component disposed in the first accommodation cavity, and a second end of the input terminal is configured to be connected to a photovoltaic string, wherein the photovoltaic string is formed by photovoltaic modules connected in series, connected in parallel, or connected in series and in parallel.

22. The photovoltaic power conversion apparatus according to claim 21, further comprising at least one direct-current switch, wherein the direct-current switch sealingly penetrates through a partial area of the first bottom wall, and an operating part of the direct-current switch is disposed outside the first accommodation cavity; and the first end of the input terminal is coupled to the power component by using the direct-current switch.

23. The photovoltaic power conversion apparatus according to claim 22, wherein a ratio of a total power of the photovoltaic string to a rated total power of the direct-current output cable is greater than 1.2, and the rated total power of the direct-current output cable is a product of a rated voltage and a rated current of the direct-current output cable; or a ratio of a total power of the photovoltaic string to a rated total power of the alternating current output cable is greater than 1.2, and the rated total power of the alternating current output cable is a product of a rated voltage and a rated current of the alternating current output cable.

24. The photovoltaic power conversion apparatus according to claim 21, wherein the second end that is of the wiring terminal and that is located in the second accommodation cavity is configured to be connected to the direct-current cable; and the second end that is of the wiring terminal and that is located in the second accommodation cavity is configured to be connected to the alternating current output cable or the direct-current output cable.

25. The photovoltaic power conversion apparatus according to claim 24, wherein a ratio of a total power of the photovoltaic string to a rated total power of the alternating current output cable is greater than 1.2, and the rated total power of the alternating current output cable is a product of a rated voltage and a rated current of the alternating current output cable.

26. The photovoltaic power conversion apparatus according to claim 1, further comprising at least one functional terminal, wherein the functional terminal sealingly penetrates through a partial area of the first bottom wall, or sealingly penetrates through a partial area of an idle side wall, wherein the idle side wall refers to a first side wall on which no second housing is disposed;

a first end of the functional terminal is located in the first accommodation cavity; and a second end of the functional terminal is configured to be connected to a power supply cable of an external device, or configured to be connected to a communication cable between the photovoltaic power conversion apparatus and the external device.

27. A photovoltaic power conversion apparatus comprising:

a first housing comprising a first housing body and a first cover plate sealingly connected using a first sealing connector to form a first accommodation cavity, wherein the first housing body and the first cover plate are detachably connected by using the first sealing connector, so that a power component can be placed or taken out on a basis of implementing sealing connection, wherein the first housing body comprises a first top wall, a first bottom wall, a back plate wall, and two first side walls, and wherein the first accommodation cavity is a sealed accommodation cavity;

the power component fixedly disposed in the first accommodation cavity;

a second housing disposed outside a connection area of the first side wall by using an installation wall, the second housing comprising a second housing body and a second cover plate to form a second accommodation cavity, wherein the second housing body comprises a second top wall, a second bottom wall having a cable inlet/outlet disposed thereon, the installation wall, and two second side walls;

a wiring terminal sealingly penetrated through a part of the connection area of the first side wall, wherein a first end of the wiring terminal is located in the first accommodation cavity and is coupled to the power component disposed in the first accommodation cavity, and wherein a second end of the wiring terminal is located in the second accommodation cavity and is configured to be connected to a power cable of the photovoltaic power conversion apparatus;

a functional board fixedly disposed in the first accommodation cavity, wherein the first end of the wiring terminal is coupled to the power component by using the functional board; and a power inductor disposed in the first accommodation cavity, wherein the first end of the wiring terminal is coupled to the power component by using the power inductor.

28. A photovoltaic power conversion apparatus comprising:

a first housing comprising a first housing body and a first cover plate sealingly connected using a first sealing connector to form a first accommodation cavity, wherein the first housing body and the first cover plate are detachably connected by using the first sealing connector, so that a power component can be placed or taken out on a basis of implementing sealing connection, wherein the first housing body comprises a first top wall, a first bottom wall, a back plate wall, and two first side walls, and wherein the first accommodation cavity is a sealed accommodation cavity;

the power component fixedly disposed in the first accommodation cavity;

a second housing disposed outside a connection area of the first side wall by using an installation wall, the second housing comprising a second housing body and a second cover plate to form a second accommodation cavity, wherein the second housing body comprises a second top wall, a second bottom wall having a cable inlet/outlet disposed thereon, the installation wall, and two second side walls;

a wiring terminal sealingly penetrated through a part of the connection area of the first side wall, wherein a first end of the wiring terminal is located in the first accommodation cavity and is coupled to the power component disposed in the first accommodation cavity, and wherein a second end of the wiring terminal is located in the second accommodation cavity and is configured to be connected to a power cable of the photovoltaic power conversion apparatus;

a functional board fixedly disposed in the first accommodation cavity, wherein the first end of the wiring terminal is coupled to the power component by using the functional board; and a controllable switch disposed in the first accommodation cavity, wherein the controllable switch is fixedly disposed on the functional board, and is configured to maintain or disconnect coupling between the first end of the wiring terminal and the power component, and the first end of the wiring terminal is coupled to the power component by using the controllable switch.

* * * * *